United States Patent [19]
Yoshida et al.

[11] 4,443,116
[45] Apr. 17, 1984

[54] ELECTRONIC TIMEPIECE

[75] Inventors: Makoto Yoshida; Shinichi Watanabe; Fuminori Suzuki, all of Tanashi, Japan

[73] Assignee: Citizen Watch Company Limited, Tokyo, Japan

[21] Appl. No.: 337,222

[22] Filed: Jan. 6, 1982

[30] Foreign Application Priority Data

Jan. 9, 1981 [JP] Japan .................................. 56-1859
Jan. 23, 1981 [JP] Japan .................................. 56-9179
Nov. 13, 1981 [JP] Japan .............................. 56-181866

[51] Int. Cl.³ ........................................... G04B 17/20
[52] U.S. Cl. .................. 368/202; 331/176; 331/177 R
[58] Field of Search .................. 368/200, 201, 202; 331/175, 176, 177 R, 179, 177 V

[56] References Cited

U.S. PATENT DOCUMENTS

| | | | |
|---|---|---|---|
| 4,024,416 | 5/1977 | Fujita et al. | 368/201 |
| 4,148,184 | 4/1979 | Akahane et al. | 368/202 |
| 4,241,435 | 12/1980 | Fujita et al. | 368/200 |
| 4,254,492 | 3/1981 | McDermott | 368/200 |
| 4,264,967 | 4/1981 | Fujita et al. | 368/200 |
| 4,290,130 | 9/1981 | Lowdenslager et al. | 368/200 |
| 4,325,036 | 4/1982 | Kuwabara | 368/202 |
| 4,344,046 | 8/1982 | Zumsteg | 331/175 |

Primary Examiner—Forester W. Isen
Attorney, Agent, or Firm—Jordan and Hamburg

[57] ABSTRACT

An electronic timepiece is provided with a timebase signal source comprising a relatively low frequency quartz crystal oscillator circuit and with means for compensating the timebase signal frequency for the effects of temperature changes on the low frequency oscillator circuit, and further with means for comparing the timebase signal frequency with the frequency of a relatively high frequency quartz crystal oscillator circuit having high stability against aging changes, to thereby compensate for changes in the timebase frequency caused by aging of the low frequency quartz crystal vibrator, this comparison being carried out only within a specific narrow range of operating temperatures.

20 Claims, 13 Drawing Figures

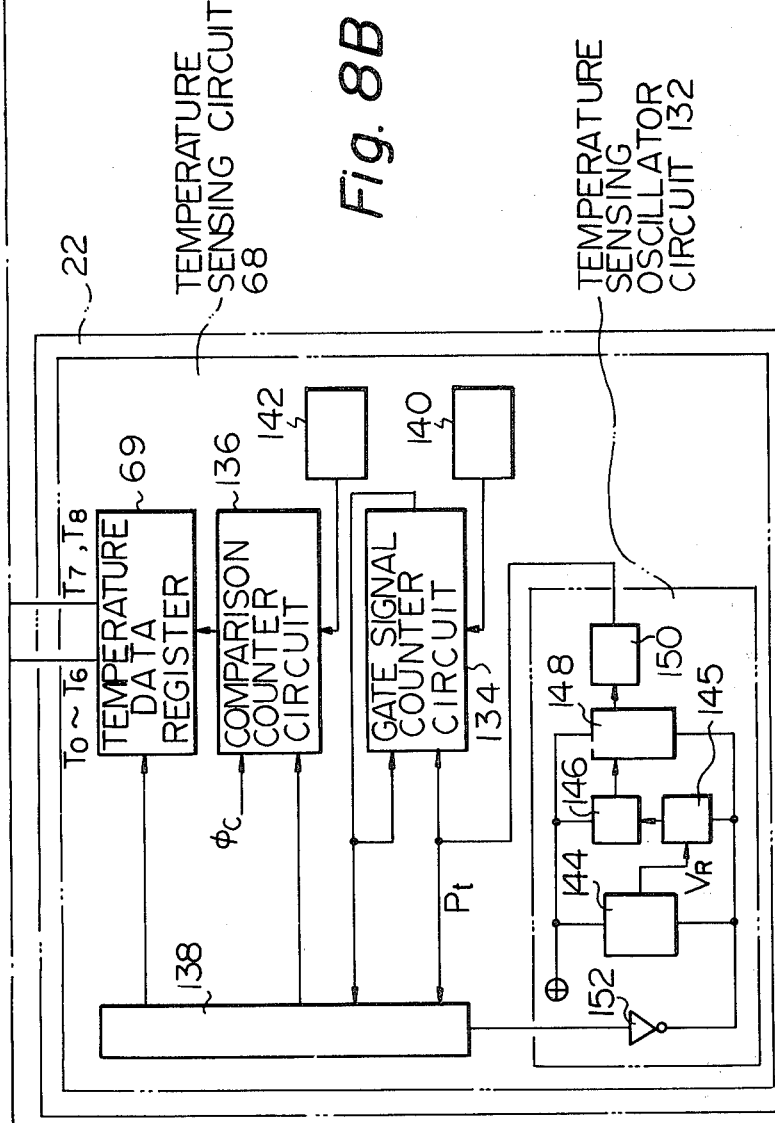

ELECTRONIC TIMEPIECE

BACKGROUND OF THE INVENTION

Electronic timepiece utilizing oscillator circuits controlled by quartz crystal vibrators to generate a timebase signal are widely utilized at present. Such timepieces can provide reasonably high timekeeping accuracy, with a timekeeping rate variation of the order of several seconds per month or several tens of seconds per year being generally attained. However it has hitherto not been practicable to provide an electronic timepiece which can be economically manufactured on a mass production basis, which would provide a timekeeping accuracy of the order of one second of rate variation per year, or less, without special measures being adopted such as selection of quartz crystal vibrators having rigidly specified characteristics. This is especially true of electronic watches, which must be of very compact construction and have a minimal level of power consumption. Generally, electronic watches employ an oscillator circuit controlled by an XY-cut quartz crystal vibrator, operating at a relatively low frequency of oscillation, i.e. a quartz crystal vibrator which operates in a mode resembling that of a tuning fork. Electronic clocks, on the other hand, generally employ a timebase oscillator circuit controlled by an AT-cut quartz crystal vibrator, which operates in a transverse vibration mode. Such a timebase oscillator circuit has an intrinsically higher level of power consumption than an XY-cut crystal vibrator controlled timebase oscillator circuit, since it operates at a substantially higher frequency of oscillation and also because of increased losses in the quartz crystal vibrator due to the different manner in which the vibrator is supported. However, each type of timebase oscillator circuit has both advantages and disadvantages in relation to the other type. For example, an oscillator circuit controlled by a XY-cut quartz crystal vibrator, operating for example at 32 KHz, displays a frequency/temperature characteristic having second order curvature, i.e. having a single frequency maximum, and so the variation in frequency of such an oscillator circuit due to temperature variations can be easily compensated, over a wide range of operating temperatures, by compensation means which are well known in the art. On the other hand, such a quartz crystal vibrator has rather poor aging characteristics, i.e. the oscillation frequency will drift gradually, over a long period of time. Such frequency drift is an inherent feature of an XY-cut quartz crystal vibrator. With an oscillator circuit employing an AT-cut quartz crystal vibrator, however, a much lower degree of frequency drift due to aging will occur. This low rate of frequency drift is inherent in such a quartz crystal vibrator, and is due to such factors as the very high frequency of oscillation, typically of the order of several magaherz, etc. But such an oscillator circuit has the disadvantage that the frequency/temperature characteristic displays third order curvature, and because of this it is difficult to compensate the frequency of oscillation of such an oscillator against frequency variations due to operating temperature changes, over a relatively wide range of temperatures.

Generally speaking, if the highest possible degree of timekeeping accuracy is desired, it is preferable to utilize an AT-cut quartz crystal vibrator type of timebase oscillator circuit. This is because, if a good specimen of such a quartz crystal vibrator is selected, then the variation of oscillation frequency with respect to temperature can be reasonably small, and because of this, in conjunction with the very low rate of frequency drift due to aging, a timekeeping rate accuracy of the order of several seconds per year can be obtained. However, such a method is not practicable for economical mass-production of electronic timepieces.

There is therefore a requirement for an electronic timepiece having a timebase oscillator circuit with a high degree of timekeeping accuracy over a wide operating temperature range, such as can be obtained by applying temperature compensation means to an oscillator circuit controlled by an XY-cut quartz crystal vibrator, and which also has a very high stability of timekeeping accuracy with respect to aging of the quartz crystal vibrator, such as can be obtained by a timebase oscillator circuit controlled by an AT-cut quartz crystal vibrator. Such a timebase oscillator circuit would eliminate the disadvantages of each type of quartz crystal vibrator, described above, and combine their advantages, and would enable a timekeeping rate accuracy of within one second per year to be attained. This objective is attained by an electronic timepiece according to the present invention, as described hereinafter. This is achieved by utilizing the output signal from an oscillator circuit controlled by an XY-cut quartz crystal vibrator as the timepiece timebase signal, with suitable temperature compensation being applied to this signal, and by utilizing the output signal from an oscillator circuit controlled by an AT-cut quartz crystal vibrator as a frequency reference, for detecting and compensating any changes in the timebase signal frequency caused by aging of the XY-cut quartz crystal vibrator, with this detection and compensation being only carried out when the operating temperature of the timepiece components is within a specific narrow range, having a width, for example, of the order of 1° C. In this way, temperature-induced variations in the oscillation frequency of the AT-cut quartz crystal vibrator have no effect upon the aging compensation operation, so that a timebase signal source of an electronic timepiece according to the present invention can be economically and practicably implemented.

SUMMARY OF THE INVENTION

The present invention relates to an electronic timepiece provided with a timebase signal source which ensures an extremely high order of timekeeping rate accuracy, to within one second per year, and which maintains this high timekeeping accuracy over a long period of time. In an electronic timepiece according to the present invention, a timebase signal is generated by an oscillator circuit controlled by an XY-cut quartz crystal vibrator and operating at a relatively low frequency of oscillation, e.g. of the order of 32 KHz, and compensation for the effects of operating temperature variations upon this quartz crystal vibrator are applied such that the timebase signal frequency is stabilized over a wide range of temperatures. In addition, frequency comparator means, and an oscillator circuit controlled by an AT-cut quartz crystal vibrator operating at a relatively high frequency, e.g. of the order of several MHz, are also incorporated. When the temperature sensing means detects that the timepiece temperature is within a predetermined narrow range (with a width of the order of 1° C., for example), then signals are generated whereby the high frequency oscillator circuit (which is normally non-operative) is periodically brought into operation and whereby the timebase signal frequency is compared with the high frequency oscillator circuit output frequency. The frequency comparator means includes means for memorizing a frequency difference between the low frequency oscillator circuit and high frequency oscillator circuit output signals which is such that the timekeeping error of the timepiece will be zero, i.e. the output signal from the AT-cut vibrator controlled oscillator circuit is used as a frequency reference. If a change is detected between the latter frequency difference and the actual frequency difference, i.e. if a drift in the timebase signal frequency (due, in most cases, to the effects of aging upon the XY-cut quartz crystal vibrator) is detected, then compensation is applied to the timebase signal in a direction such as to eliminate the deviation detected in the timebase signal frequency.

In this way, the AT-cut quartz crystal vibrator controlled oscillator circuit serves to produce a reference frequency signal whereby the effects of aging of the XY-cut quartz crystal vibrator controlled oscillator circuit can be compensated, while the latter oscillator circuit is precisely compensated for frequency changes due to temperature variations, over a wide range of temperatures. In this way, the frequency-versus-temperature characteristic of the timebase signal is extremely stable over a wide range of temperatures, and this stability is maintained over a long time period. The advantages of both an XY-cut quartz crystal vibrator controlled oscillator circuit and an AT-cut quartz crystal vibrator controlled oscillator circuit are thereby combined such as to obtain a very high level of timekeeping accuracy. However, since the high frequency AT-cut quartz crystal vibrator controlled oscillator circuit is only set into operation periodically, there is no substantial increase in power consumption brought about by the incorporation of this circuit. In addition, since the AT-cut quartz crystal vibrator controlled oscillator circuit is only used as a frequency reference within a single narrow range of temperatures, the frequency-versus-temperature characteristic of this quartz crystal vibrator are not in any way critical, so that selection of particular AT-cut quartz crystal vibrators is not necessary.

From the above it can be understood that the high level of timekeeping accuracy obtained with an electronic timepiece according to the present invention, does not involve any significant penalty in the form of increased cost or increased power consumption, and therefore is highly suited to electronic watches produced on a mass-production basis.

BRIEF DESCRIPTION OF THE DRAWINGS

FIGS. 8a and 8b are circuit diagrams of an electronic timepiece according to the present invention, showing specific embodiments of a temperature compensation circuit and a temperature sensing circuit;

DESCRIPTION OF THE PREFERRED EMBODIMENTS

Figure 1:
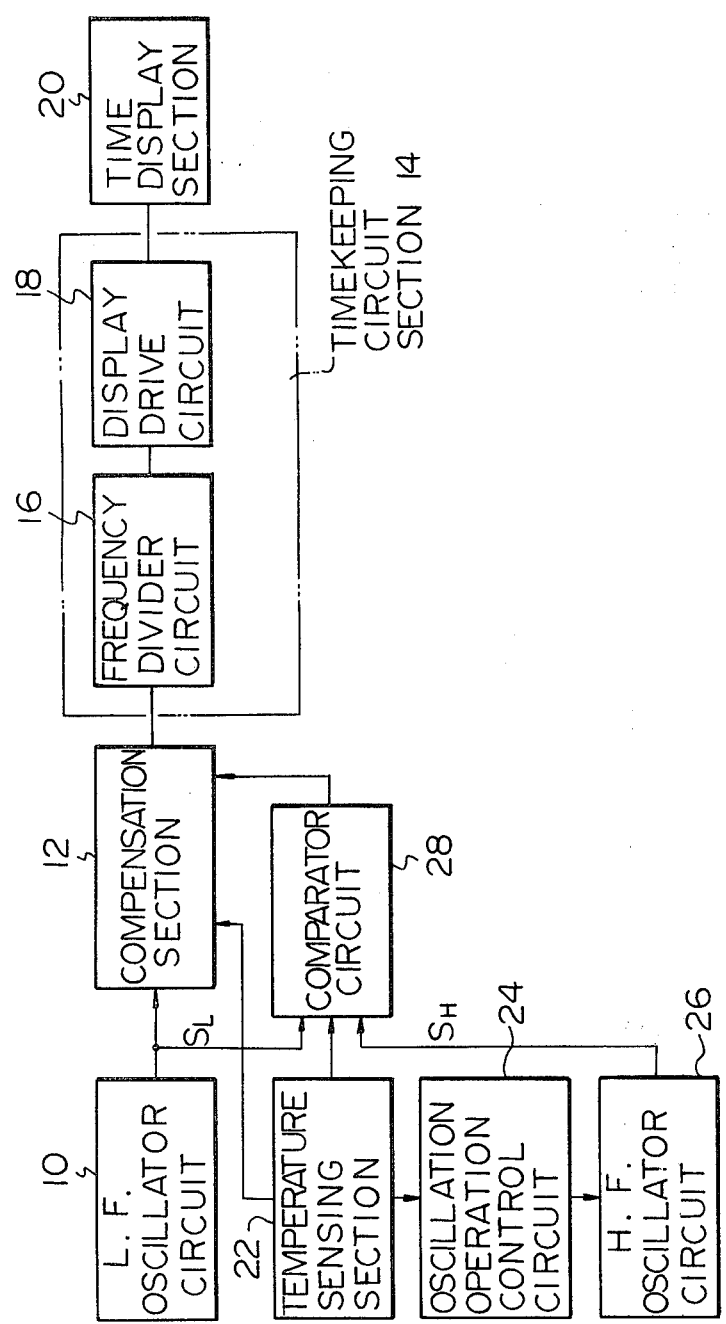
FIG. 1 is a general block diagram to illustrate the basic concepts of an electronic timepiece according to the present invention.

FIG. 1 is a general block diagram for illustrating the basic concepts of an electronic timepiece according to the present invention. In FIG. 1, numeral 10 denotes an oscillator circuit controlled by an XY-cut quartz crystal vibrator, operating at a relatively low frequency of oscillation, and which serves to produce a timebase signal. For brevity of description, the latter oscillator circuit will be referred to as the LF oscillator circuit. Numeral 12 denotes a compensation section, which acts to perform compensation of the timebase signal frequency to stabilize the latter against changes due to temperature variations or to the effects of aging of the quartz crystal vibrator in LF oscillator circuit 10. After compensation, the timebase signal is input to a timekeeping circuit section 14, which comprises a frequency divider circuit 16. This produces a unit time signal that is input to a display drive circuit 18. Display drive signals are thereby output by display drive circuit 18 and are applied to a time display section 20, comprising analog or digital display means, for displaying current time information. A temperature sensing section 22 serves to produce signals indicative of temperature variations, as described hereinafter, for frequency compensation purposes. Numeral 26 denotes an oscillator circuit controlled by an AT-cut quartz crystal vibrator, operating at a relatively high frequency, in the MHz range. For brevity of description, the latter oscillator circuit will be referred to as the HF oscillator circuit. HF oscillator circuit 26 is normally inoperative, and is set in operation intermittently under the control of signals from an oscillation control circuit 24. The oscillation control circuit 24 is responsive to signals generated by temperature sensing section 22 indicating that the timepiece temperature is within a specific narrow range of temperatures (for example, from 24° to 25° C.), for setting HF oscillator circuit 26 into operation during periodically repeated brief time intervals. During these time intervals, the frequencies of the timebase signal and of the output signal from HF oscillator circuit 26 are compared by means of a comparator circuit 28. If this comparison indicates that the timebase signal frequency has deviated from a value having a certain predetermined relationship with the frequency of operation of HF oscillator circuit 26 (e.g. from a value which is an integral sub-multiple of the operating frequency of HF oscillator circuit 26), then signals will be applied from comparator circuit 28 to compensation section 12 in such a way as to eliminate that deviation.

In addition to the function described above for temperature sensing section 22, i.e. indication that the timepiece temperature is within a certain specific narrow range, temperature sensing section 22 also has the function of continuously generating data indicative of the timepiece temperature, and applying this to compensation section 12 for thereby compensating the timebase signal for frequency variations caused by the effects of temperature variations upon the XY-cut quartz crystal vibrator in LF oscillator circuit 10.

The frequency of the output signal from HF oscillator circuit 26, within the specific narrow temperature range referred to above, is extremely stable over a long period of time. It will thus be apparent that the first of the frequency compensation operations described above, in which compensation is performed on the basis of comparison of the timebase signal frequency with that of HF oscillator circuit 26, will compensate for any changes in the timebase signal frequency caused by factors other than temperature variations, and which are mainly due to aging of the XY-cut quartz crystal vibrator of LF oscillator circuit 10. The second frequency compensation operation described above, on the other hand, is based upon the known frequency/temperature characteristics of LF oscillator circuit 10, and cannot compensate for any long-term frequency drift due to aging effects.

For these reasons, the first of these type of compensation operations will be referred to herein as "aging compensation", while the second compensation operation will be referred to as "temperature compensation".

It should be noted that in the present specification and claims, the term "temperature" unless otherwise indicated designates the operating temperature of the components in HF oscillator circuit 26 and LF oscillator circuit 10. The present invention is primarily directed towards an electronic wristwatch, and since such a timepiece is worn close to the user's body, it is possible to select a value for the specific narrow range of temperatures referred to above which will be, at least occasionally, attained within the timepiece case. Even if the timepiece is worn under extreme conditions of environmental temperatures, it can be anticipated that the temperature within the case will reach a value of the order of 25° C. fairly regularly, and so the specific narrow range of temperatures can be selected to be close to the latter temperature. Even if the temperature within the timepiece case should only reach the latter specific narrow range fairly infrequently, this will have no significant effect upon the aging compensation operation of the timepiece, since a timekeeping rate deviation caused by the effects of component aging will only develop slowly over a long period of time. It is thus not necessary to perform aging compensation operations very frequently, so that it is not necessary that the timepiece attain the above-mentioned narrow range of temperatures very frequently. This fact is the basis for the aging compensation operation of an electronic timepiece according to the present invention.

It should also be noted that the manner in which compensation section 12 is interconnected with the other circuit sections in FIG. 1 is to be understood as being purely illustrative, and simply indicative of the fact that compensation section 12 performs frequency compensation of the timebase signal which is generated by LF oscillator circuit 10. Various methods of controlling a signal frequency for timekeeping rate compensation are known in the art, and any of these methods is applicable to an electronic timepiece according to the present invention. For example, as in the preferred embodiment described hereinafter, frequency compensation can be performed by variation of the input or output capacitance of LF oscillator circuit 10. Alternatively, a variable-division ratio frequency divider circuit may be inserted between the output of LF oscillator circuit 10 and timekeeping circuit section, with the division ratio of that frequency divider circuit being varied to bring about compensation. In addition, the temperature compensation operation and aging compensation operation may act on the timebase signal frequency using common control means, or, as in the case of the preferred embodiment, may operate independently of one another.

Figure 2:
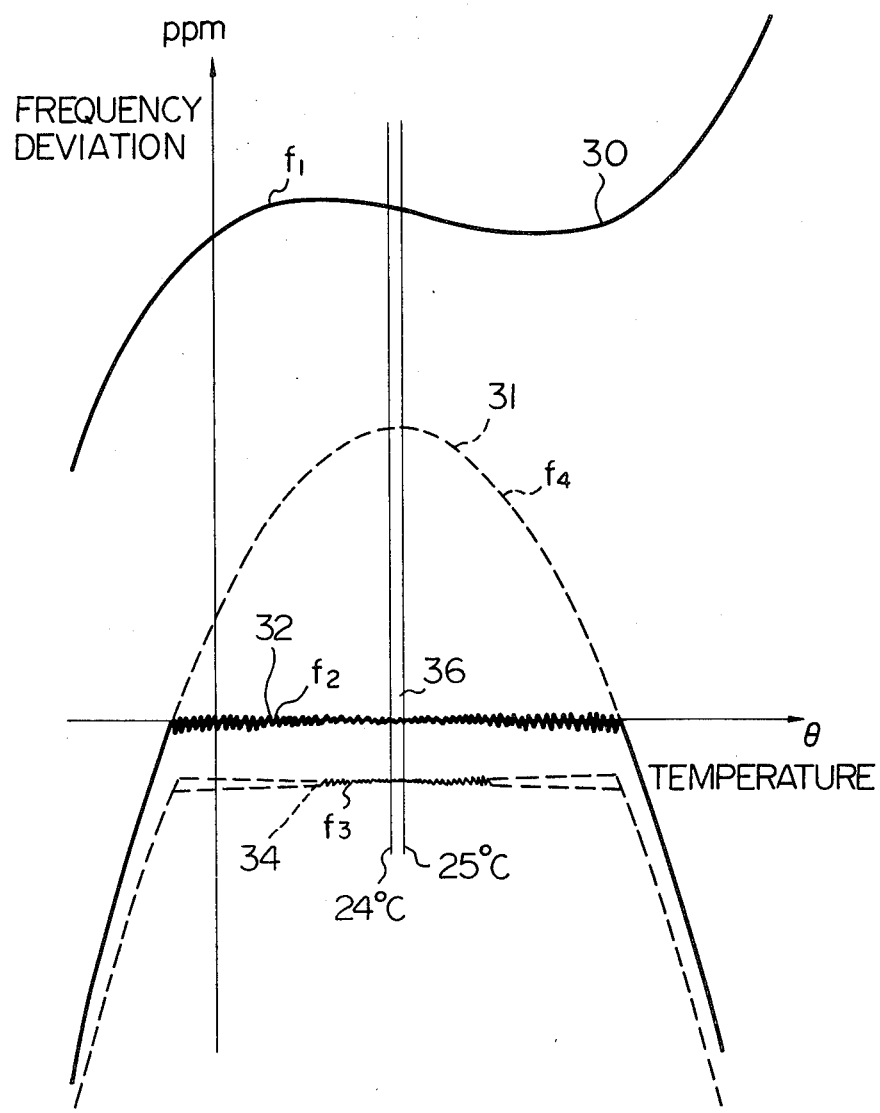
FIG. 2 shows typical frequency/temperature characteristics of oscillator circuits used in an electronic timepiece according to the present invention and the effects of temperature compensation thereon.

Referring now to FIG. 2, typical frequency/temperature characteristics for the oscillator circuits of an electronic timepiece according to the present invention are shown. In FIG. 2, the vertical axis represents frequency deviation in units of ppm (parts per million), while the horizontal axis represents temperature. Numeral 30 shows a typical characteristic for an oscillator circuit controlled by an AT-cut quartz crystal vibrator. As can be seen, this exhibits third-order curvature, with a single point of inflexion. It is difficult to perform compensation of such a characteristic for temperature-induced frequency deviations, due to the type of curvature displayed, and this difficulty is increased by the fact that the shape of the characteristic and its position with respect to the axes can vary significantly for different specimens of quartz crystal vibrator. However such a characteristic is very stable over a long period of time.

Numeral 31 denotes the frequency/temperature characteristic of a typical XY-cut quartz crystal vibrator controlled oscillator circuit. This exhibits second-order curvature, with a single frequency maximum, and the shape and position of the characteristic can be made extremely consistent for different quartz crystal vibrators. As a result, frequency compensation for changes due to temperature variations can be effectively provided. The characteristic can thereby be made extremely flat with respect to temperature, as indicated by numeral 32, so that the frequency deviation can in effect be reduced almost to zero, over a wide range of temperatures.

Because of this, an electronic timepiece having a timebase signal oscillator circuit employing an XY-cut quartz crystal vibrator, with temperature compensation, will at first exhibit a very high degree of timekeeping accuracy. However, over a long period of time, the frequency/temperature characteristic of such an oscillator circuit will drift, with respect to the frequency axis, to become for example as indicated by numeral 34. As seen, the characteristic is still flat over a wide range of temperatures, but displays a fixed amount of deviation over that range.

With the present invention, however, the timebase signal frequency produced by an XY-cut quartz crystal vibrator oscillator circuit is initially adjusted, at the time of manufacture for example, such that the timebase signal frequency deviation is zero, i.e. such that the timekeeping rate of the timepiece is accurate. Then the frequency of the H.F. oscillator signal is adjusted, or a memory circuit in the comparator circuit is adjusted, such that predetermined signals are produced by the comparator circuit. Thereafter, whenever the timepiece temperature is within a specific narrow range, such as the range 24° to 25° C. in the example of FIG. 2, the frequencies of the LF oscillator 10 and HF oscillator circuit 26 output signals are compared by comparator circuit 28. If the difference between these frequencies changes, then an error signal is applied from comparator circuit 28 to compensation section 12 to compensate for the deviation of the LF oscillator circuit output. In this way, any drift in the timebase signal frequency due to aging of the quartz crystal vibrator in LF oscillator circuit 10 is accurately compensated.

It will be apparent that this aging compensation operation will not be affected by the shape and position of the characteristic 30 of the AT-cut quartz crystal vibrator controlled oscillator circuit, since the output signal from this circuit is only used as a frequency reference within the narrow range of temperatures denoted by numeral 36 in FIG. 2.

For optimum temperature compensation of LF oscillator circuit 10, it is preferable to arrange that the frequency maximum of the frequency/temperature characteristic of this circuit is approximately positioned at the center of the normal operating temperature range, i.e. in the example of FIG. 2 at about 24.5° C.

The above can be summarized as follows, designating the frequency of HF oscillator circuit 26 as $f_1$, for the characteristic 30 shown in FIG. 2, that of LF oscillator cirucit 10 as $f_2$, for characteristic 32 of FIG. 2, and as $f_3$ for characteristic 34 in FIG. 2. Firstly, data is stored in comparator circuit 28 which represents the frequency difference ($f_1-f_2$). Subsequently, when the temperature is within the specific narrow range 36 (referred to hereinafter as the specific temperature range), the HF and LF oscillator circuit frequencies are compared, and if a difference ($f_1-f_3$) is detected between them, then signals from comparator circuit 28 cause compensation circuit 12 to compensate the output from LF oscillator circuit 10 such as to eliminate the frequency deviation ($f_2-f_3$), which is due to aging of the XY-cut quartz crystal vibrator.

It can thus be seen that comparator circuit 28 has two separate functions with respect to aging compensation, namely the function of memorizing initial data representing ($f_1-f_2$), i.e. the condition in which the aging error is zero, and the function of measuring the difference ($f_2-f_3$), performed in response to a command from temperature sensing section 22, i.e. of measuring the amount of aging error which must be compensated for. In the following, the former function will be referred to as the initial data storage function, while the latter function will be referred to as the correction data generation function.

Figure 3:
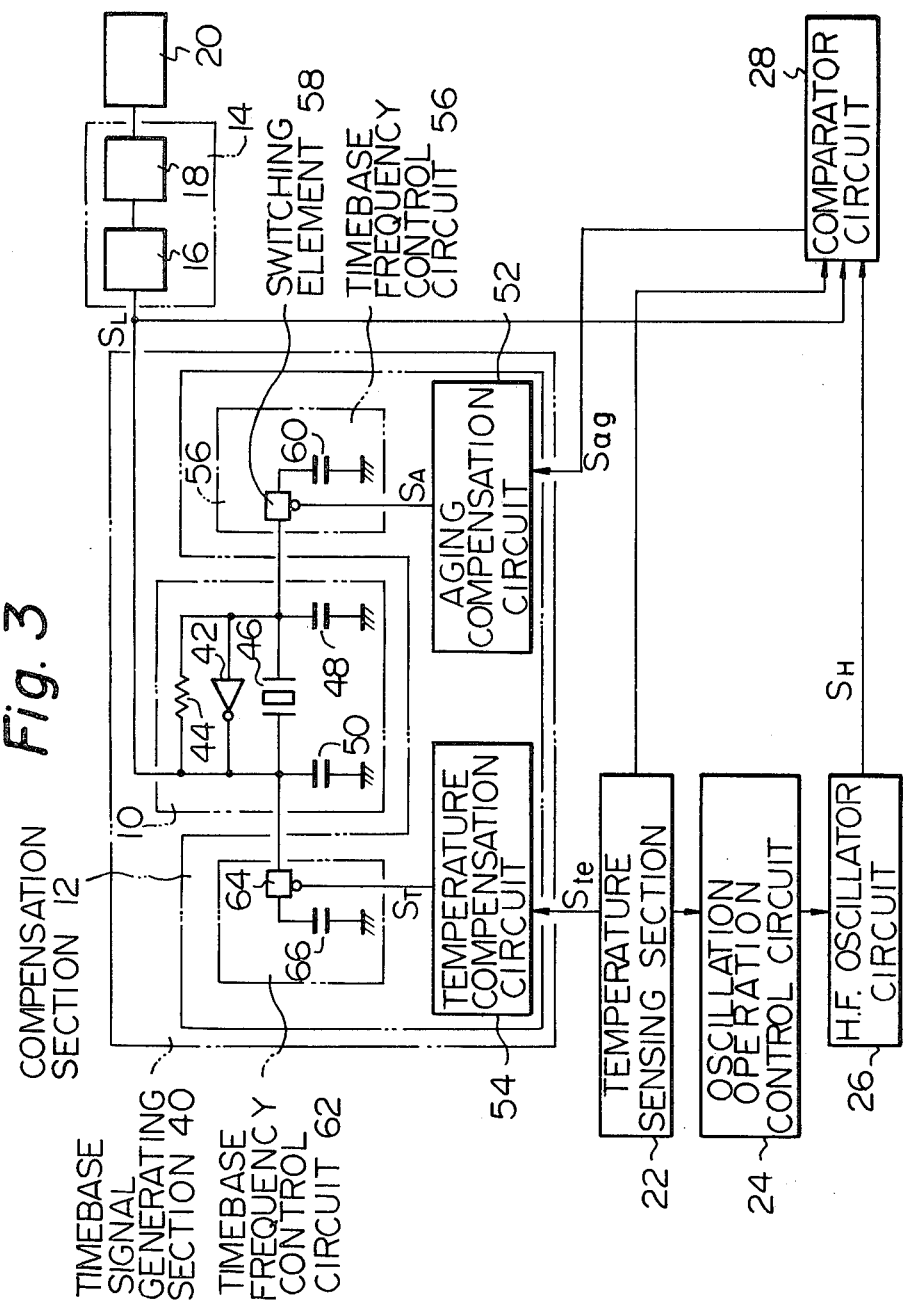
FIG. 3 is a general circuit diagram of an embodiment of an electronic timepiece according to the present invention, incorporating a capacitance-switching method of frequency compensation control.

FIG. 3 is a general circuit diagram of an embodiment of an electronic timepiece according to the present invention, showing a specific example of circuits of LF oscillator circuit 10 and compensation section 12, which are collectively designated as timebase signal generating section 40. The timebase signal which is generated from LF oscillator circuit 10 in this section will be referred to hereinafter as $S_L$, and its frequency as $f_L$. The output signal from HF oscillator circuit 26 will be designated as $S_H$, and its frequency as $f_H$. LF oscillator circuit 10 is a commonly used type of circuit, comprising a CMOS inverter 42, a feedback resistor 44, a quartz crystal vibrator 46, and input and output capacitors 48 and 50 respectively. In this embodiment, frequency control is provided by a switching element 64, which switches a capacitor 66 into parallel connection with output capacitor 50 of LF oscillator circuit 10 on a time-division basis, in response to temperature compensation signal $S_T$. In this embodiment, switching element 58 acts to connect capacitor 60 in parallel with input capacitor 48 when aging compensation signal $S_A$ is at the low logic level (referred to hereinafter as the L level), thereby bringing about a lowering of the frequency of timebase signal $S_L$. Similarly, switching element 64 acts to increase the output capacitance of LF oscillator circuit 10 each time temperature compensation signal $S_T$ goes to the L level, thereby lowering the frequency of timebase signal $S_L$.

The combination of timebase frequency control circuit 56 and aging compensation circuit 52 will be referred to as the first compensation means, while that of timebase frequency control circuit 62 and temperature compensation circuit 54 will be referred to as the second compensation means. The duty ratio for which aging compensation signal $S_A$ is at the high logic level (referred to hereinafter as the H level) will be designated as $D_A$, while the duty ratio of temperature compensation signal $S_T$ will be designated as $D_T$. Thus, control of timebase signal frequency $f_L$ is achieved by selectively varying the total input and output capacitances of LF oscillator circuit 10.

In compensation section 12, aging compensation circuit 52 receives an aging data signal, designated hereinafter as $S_{ag}$ from comparator circuit 28, and produces aging compensation signal $S_A$ in response. A temperature compensation circuit 54 receives temperature data signals, designated as $S_{te}$ from temperature sensing section 22, and produces temperature compensation signal $S_T$. Compensation section 12 further comprises two timebase frequency control circuits 56 and 62, which receive the aging compensation signal $S_A$ and temperature compensation signal $S_T$ respectively. The timebase frequency control circuit 56 comprises a switching element 58 and a capacitor 60, which is selectively switched into parallel connection with input capacitor 48 of LF oscillator circuit 10 (capacitors 48 and 50 may simply comprise stray capacitances, rather than specific components), to thereby vary the effective total input capacitance of LF oscillator circuit 10, this switching being performed on a time-division basis under the control of aging compensation signal $S_A$. Similarly, the effective output capacitance of LF oscillator circuit 10 is varied by the action of switching element 64, which switches capacitor 66 into parallel with output capacitor 50 of LF oscillator circuit 10 when temperature compensation signal $S_T$ is at the L level, thereby lowering the frequency of signal $S_L$. The difference between the frequency $f_L$ of timebase signal $S_L$ when $D_A$ is equal to 1, i.e. when aging compensation signal $S_A$ is fixed at the H level, and the frequency of signal $S_L$ when $D_A$ is equal to 0, i.e. when aging compensation signal $S_A$ is fixed at the L level, will be designated as $f_{SWA}$. Similarly, the difference between the frequency of timebase signal $S_L$ when $D_T$ is equal to 1 and the frequency of $S_L$ when $D_T$ is equal to 0 will be designated as $f_{SWT}$. In the present embodiment, the frequency shift $f_{SWA}$ resulting from changes in $D_A$ and frequency shift $f_{SWT}$ resulting from changes in $D_T$, are independent of one another. In addition, the frequency shifts produced by changes in $D_A$ and $D_T$ will vary linearly with these duty ratio changes. As a result, the average value of the timebase signal frequency $f_L$ from LF oscillator circuit 10 is given by the following equation:

$$f_L = f_B - f_{SWA} \times (1 - D_A) - f_{SWT} \times (1 - D_T) \qquad (1)$$

where $f_B$ denotes the value of $f_L$ when both $D_A$ and $D_T$ are equal to 1, i.e. when capacitors 60 and 66 are effectively isolated from LF oscillator circuit 10. In other words, frequency $f_L$ can be considered to be the sum of the basic timebase signal frequency $f_B$, with a temperature compensation quantity:

$$-f_{SWT} \times (1-D_T)$$

and an aging compensation quantity:

$$-f_{SWA} \times (1-D_A)$$

added thereto.

Figure 4A:
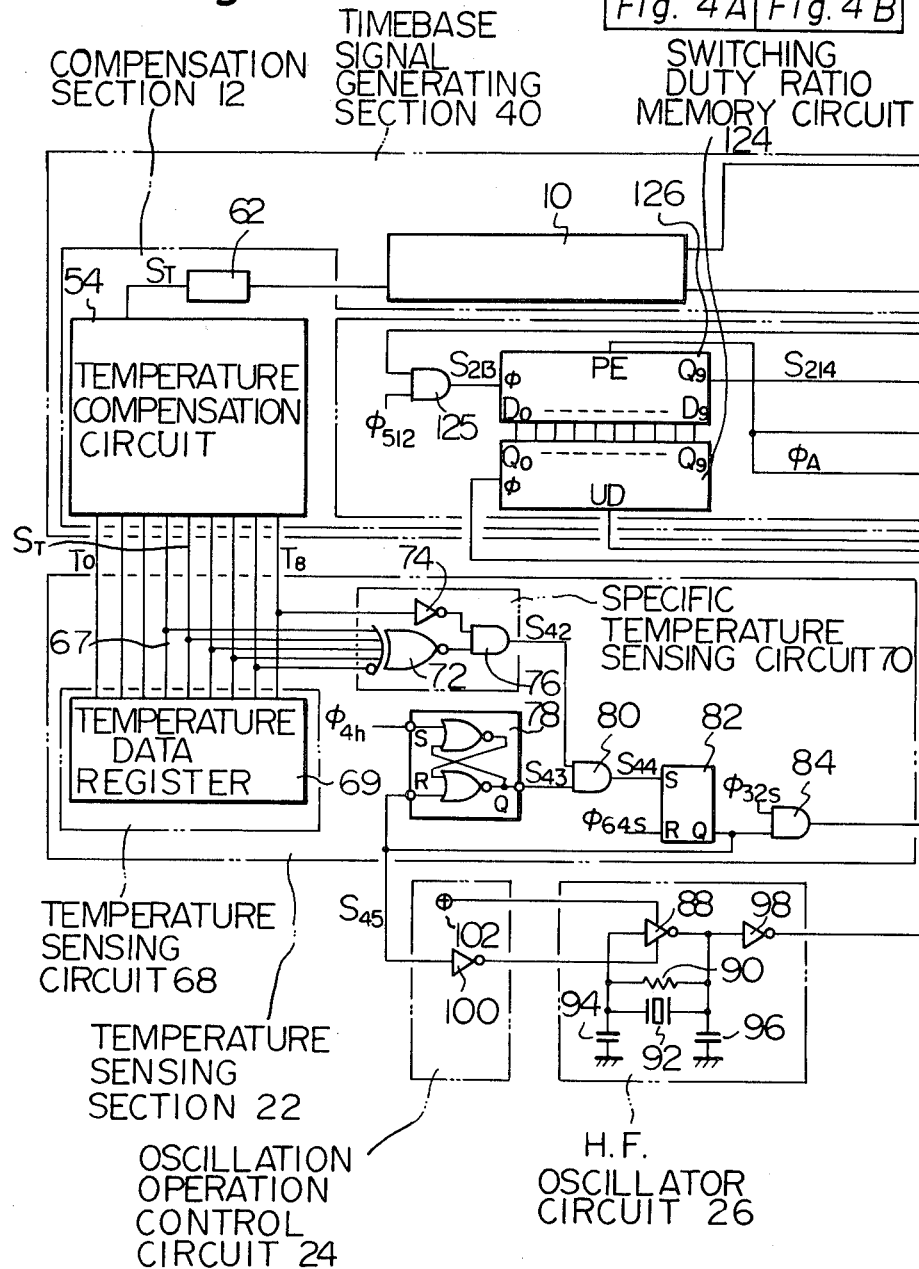
FIGS. 4a and 4b are circuit diagrams of an embodiment of a timebase signal source for an electronic timepiece according to the present invention.
Figure 4B:
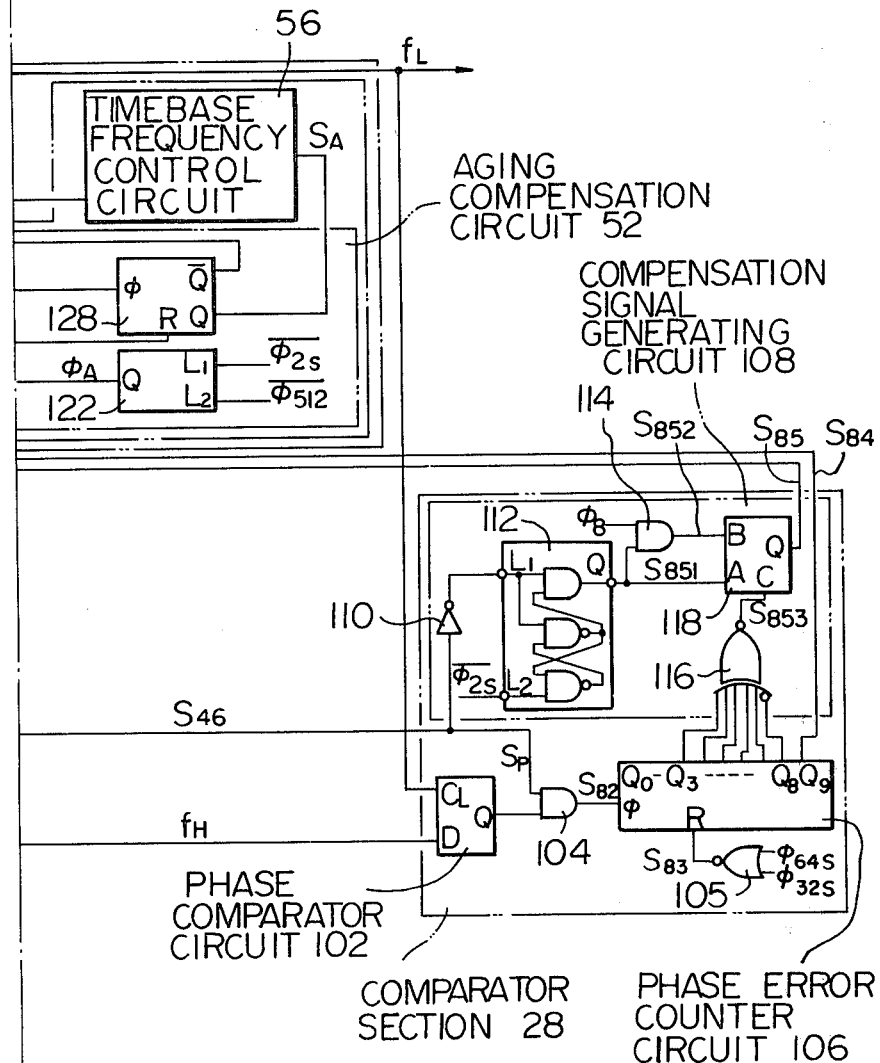

FIG. 4 is a circuit diagram showing specific circuit arrangements for timebase signal generating section 40, temperature sensing section 22, HF oscillator circuit 26, comparator section 28, and oscillation operation control circuit 24. The circuits of FIG. 4 will be described with reference to FIG. 5, FIG. 6 and FIG. 7. Referring first to the temperature sensing section 22, numeral 68 denotes a temperature sensing circuit which includes a temperature data register 69, which produces temperature data signals $S_T$, comprising 9 bits from $T_0$ to $T_8$. These collectively express a temperature value T, in the following form:

$$T = T_0 \times 2^0 + T_1 \times 2^1 + T_8 \times 2^8 \qquad (2)$$

The circuit of temperature sensing circuit 68 will be described in detail hereinafter. The circuit is such that the temperature value T varies in proportion to changes in timepiece temperature.

Numeral 70 denotes a specific temperature sensing circuit, which includes an exclusive-NOR gate (abbreviated hereinafter to XNOR gate) 72, receiving as inputs bits $T_3$ to $T_6$ and $\overline{T_7}$ from temperature data register 69. XNOR gate circuit 72 produces an output at the H level when all of these input signals are identical. The specific temperature sensing circuit 70 also includes an AND gate 76 which receives as inputs the output signal from XNOR gate 72 and also bit $T_8$ from temperature data register 69, after inversion by an inverter 74. Numeral 78 denotes a set-reset flip-flop, (abbreviated hereinafter to RS FF), which comprises two NOR gates. A signal which is synchronized with the operation of timekeeping circuit section 14 i.e. $\phi_{4h}$ is applied to the set terminal S of RS FF 78, while an oscillation timing signal $S_{45}$, described hereinafter, is applied to the reset terminal R. A comparison time condition signal $S_{43}$ is output from terminal Q.

In the following, signals produced by frequency division of the timebase signal will be designated by the symbol $\phi$ and a subscript designating the frequency or period of that signal. In the case of the period being designated, then the letter h will be added to indicate a period in hours, and the letter s to indicate a period in seconds.

In temperature sensing section 22, an AND gate 80 receives as inputs the specific temperature condition signal $S_{42}$ and the comparison time condition signal $S_{43}$, and produces as output the comparison condition signal $S_{44}$. Signal $S_{44}$ is applied to the set terminal S of an RS FF 82, while timing signal $\phi_{64s}$ is applied to the reset input R. RS FF 82 produces the oscillation timing signal $S_{45}$ from output Q. Signal $S_{45}$ is applied to one input of an AND gate 84, to whose other input the 32 second period timing signal $\phi_{32s}$ is applied. AND gate 84 produces as output the comparison timing signal $S_{46}$.

Figure 5:
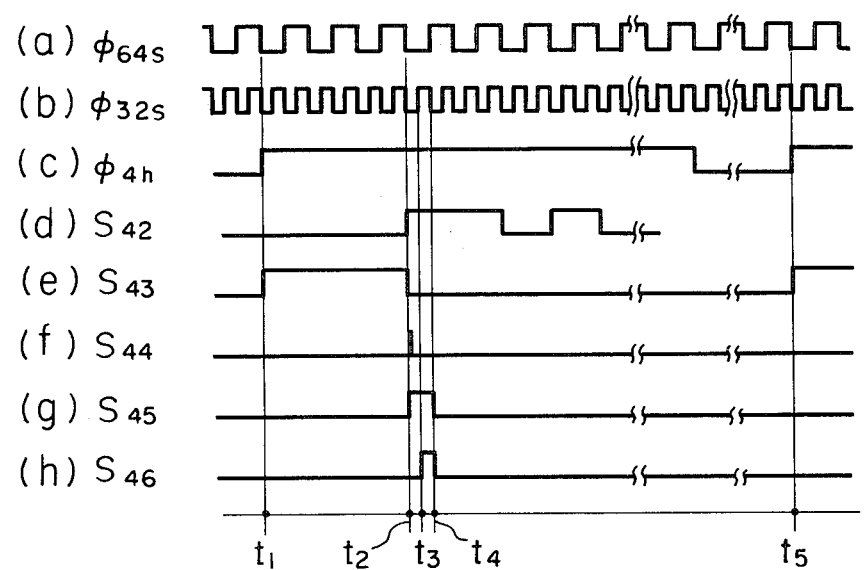
FIG. 5, FIG. 6 and FIG. 7 are timing diagrams for assistance in describing the operation of the circuits of FIG. 4.

The operation of temperature sensing section 22 will now be described, with reference to the timing diagram of FIG. 5. FIG. 5(a), (b) and (c) show the synchronized timing signals $\phi_{64s}$, $\phi_{32s}$ and $\phi_{4H}$, having periods of 64 seconds, 32 seconds and 4 hours respectively. FIG. 5(d) shows the specific temperature condition signal $S_{42}$, FIG. 5(e) shows the comparison time condition signal $S_{43}$, FIG. 5(f) shows the comparison condition signal $S_{44}$, FIG. 5(g) shows the oscillation timing signal $S_{45}$, FIG. 5(h) shows the comparison timing signal $S_{46}$. A temperature data value T is stored in temperature data register 69, and is input thereto on the falling edge of signal $\phi_{64s}$. If bits $T_3$, $T_4$, $T_5$ and $T_6$ and $\overline{T_7}$ are all at the same logic level, and if bit $T_8$ is at the L level, then the temperature data value meets the condition:

$$120 \leq T > 136$$

and in this case the specific temperature condition signal $S_{42}$ is produced at the H level. At time t1, as shown in FIG. 5, RS FF 78 is set upon the rising edge of signal $\phi_{4h}$, so that comparison time condition signal $S_{43}$ goes to the H level as shown in FIG. 5(f). With comparison time condition signal $S_{43}$ at the H level, at time t2 as shown in FIG. 5(e), if the specific temperature condition signal $S_{42}$ is at the H level, then the comparison condition signal $S_{44}$ will rise to the H level so that as shown in FIG. 5(g), oscillation timing signal $S_{45}$ will also rise to the H level. As a result of timing signal $S_{45}$ going to the H level, comparison time condition signal $S_{43}$ returns to the L level, so that as shown in FIG. 5(f), the comparison condition signal $S_{44}$ returns to the L level. At time t4, RS FF 82 is reset by signal $\phi_{64s}$, so that as shown in FIG. 5(g) the oscillation timing signal $S_{45}$ returns to the L level. As shown by FIG. 5(g), while the oscillation timing signal $S_{45}$ is at the H level, from time t2 to t4, the logical product of signal $S_{45}$ and timing signal $\phi_{32s}$ is generated by AND gate 84. Thus, comparison timing signal $S_{46}$ goes to the H level during the interval from t3 to t4. Comparison time condition signal $S_{43}$, which goes to the L level at time t2, remains at that level until the next rising edge of synchronized timing signal $\phi_{4h}$, i.e. for a time period extending from t2 to t5. Thus, the oscillation timing signal $S_{45}$ goes to the H level for an interval of 32 seconds, repeated with a minimum repetition period of 4 hours, so long as the temperature data value T is within the range $120 \geq T > 136$.

In addition, comparison timing signal $S_{46}$ goes to the H level during a 16 second interval, during the last half of each interval in which oscillation timing signal $S_{45}$ is at the H level.

The embodiment shown of HF oscillator circuit 26 is a commonly used configuration, comprising an oscillation inverter 68, a feedback resistor 90, a AT-cut quartz crystal vibrator 92, input and output capacitors 94 and 96, and a waveform shaping inverter 98.

Oscillation operation control circuit 24 serves to control the supply of power to oscillation inverter 88 in HF oscillator circuit 26. Inverter 100 of oscillation operation control circuit 24, whose output is coupled to the negative power supply terminal of inverter 88, serves to invert the oscillation timing signal $S_{45}$ from temperature sensing section 22. Thus, when oscillation timing signal $S_{45}$ is at the L level, then H level potentials are applied to both the positive and negative power supply terminals of oscillation inverter 88, i.e. power to inverter 88 is cut off, and operation of HF oscillator circuit 26 is inhibited. When signal S45 goes to the H level, then an L level output is produced from inverter 100, so that power is supplied to oscillation inverter 88 and operation of HF oscillator circuit 26 is enabled. Thus, signal $S_H$ is only produced by HF oscillator circuit 26 while signal S45 is at the H level.

The operation of comparator section 28 will now be described. Numeral 102 denotes a data-type flip-flop, which is used as a phase comparator circuit to compare the phase of signal $S_L$ and signal $S_H$. Signal $S_H$ is applied to the data input terminal of flip-flop 102, and signal $S_L$ or a signal which is obtained by dividing signal $S_L$ is applied to the clock input terminal CL. A phase error is signal Sp, comprising a train of pulses whose frequency proportional to the phase difference between signals $S_L$ and $S_H$, is output by FF 102. Signal Sp is applied to one input of an AND gate 104, which receives comparison timing signal S46 at another input, so that AND gate 104 produces a phase error pulse group signal S82, comprising periodically generated bursts of pulses of signal Sp. A NOR gate 105 receives synchronized timing signals $\phi_{64s}$ and $\phi_{32s}$, and produces as output a phase error clear signal S83. This signal is applied to the reset terminal R of a 10-stage counter 106, which will be referred to herein as the phase error counter. Phase error pulse group signal S82 is applied to the clock input terminal CL of phase error counter 106, which produces a compensation sign signal S84 from an output terminal Q9. Numeral 108 denotes a compensation signal generating circuit, which includes a latch circuit 112. This has the inverted form of signal S46 applied to an input terminal L1 from an inverter 110, and receives synchronized timing signal $\overline{\phi_{2s}}$ at an input terminal L2, and serves to produce a 1-pulse compensation signal S851 from terminal Q. An AND gate 114 receives this 1-pulse compensation signal S851 and also the timing signal $\phi_8$, having a frequency of 8Hz, and produces an 8-pulse compensation signal S852. An XNOR gate 116 receives the outputs from the third to eighth stages of counter circuit 106, i.e. the outputs from Q3 to Q7 and the inverted output $\overline{Q8}$ from that counter circuit, and produces as output a specific phase error signal S853. An AB-selector circuit 118 serves to transfer either the 1-pulse compensation signal S851 or the 8-pulse compensation signal S852 to output terminal Q thereof, under the control of the specific phase error signal S853 which is applied to a control input terminal C, with the output signal from AB-selector circuit 118 being designated as pulse compensation signal S85. In this embodiment, AB-selector 118 transfers the signal applied to input A to output terminal Q so long as the signal applied to control input C is at the H level, and transfers the signal applied to terminal B to output Q if the signal applied to control terminal C is at the L level.

Figure 6:
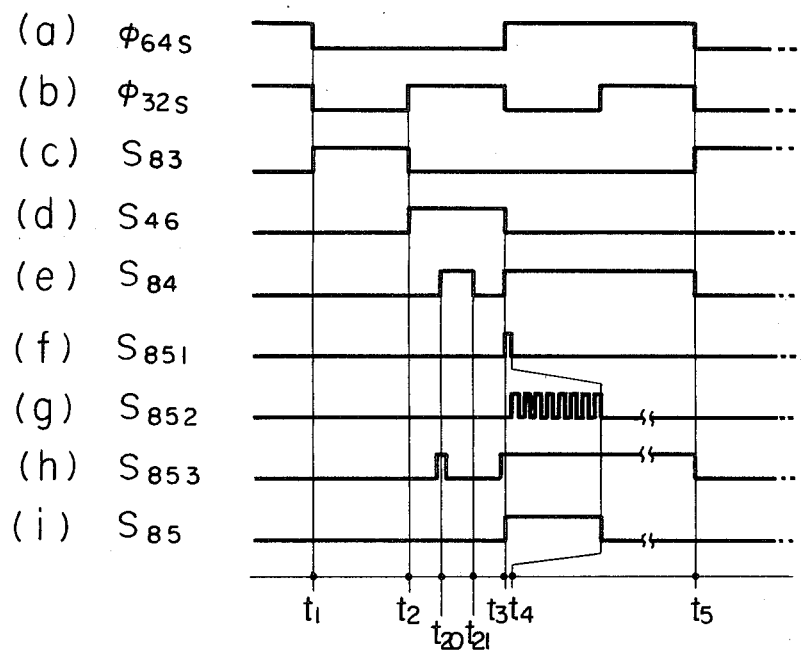

The operation of comparator section 28 will be described with reference to the timing diagram of FIG. 6, in which FIG. 6(a) and (b) show synchronized timing signals $\phi_{64s}$ and $\phi_{32s}$ respectively, FIG. 6(c) shows the phase error clear signal S83, FIG. 6(d) shows the comparison timing signal S46, 6(e) shows the compensation timing signal S84, FIG. 6(f) shows the 1-pulse compensation signal S851, FIG. 6(g) shows the 8-pulse compensation signal S852, FIG. 6(h) shows the specific phase error signal S853, and FIG. 6(i) shows the pulse compensation signal S85. The duration of the interval from t1 to t3 is 32 seconds, and from t3 to t4 is 1 second. Phase clear signal S83 remains at the H level from time t1 to t2, as shown in FIG. 6(c). Phase counter 106 is thereby reset, so that as shown in FIG. 6(e), compensation sign signal S84 goes to the L level. In the interval from t2 to t3, comparison timing signal S46 is at the H level, so that as described above, temperature sensing section 22 produces oscillation timing signal S45 at the H level from time t1 to t3. As a result, since HF oscillator circuit 6 is operative during that time, phase comparator circuit 102 generates signal Sp indicating the phase difference between signals $S_H$ and $S_L$, i.e. performs this phase comparison by using signal $S_L$ as a smapling signal. Phase error signal Sp is passed through AND gate 104 while signal S46 is at the H level, and the pulses in the resultant phase error pulse group signal S82 are counted by phase counter 106, in the interval from t2 to t3, i.e. a 16 second interval.

At time t2, the contents of phase error counter 106 are zero, so that signal S84, which represents the most significant bit of counter 106 contents, is at the L level. If the count in counter 106 has reached a value of 512 by time t20, then S84 goes to the H level at that time. Subsequently, at time t21, overflow of counter 106 occurs, i.e. the count goes from a maximum of 1023 back to zero so that S84 returns to the L level. The latter changes in the compensation sign signal S84 will be successively repeated as counting continues in the time interval from t21 to t3. In addition, during the interval from t2 to t3, the specific phase error signal S853 will go to the H level each time the count in counter 106 reaches a value in the range from 504 to 520. If the contents of phase error counter 106 at time t3 are designated as the phase error count value Cp, then this is given by the following equation:

$$Cp = (f_p \times 16) - 2^{10} \times n_p \dots \dots \quad (3)$$

Here, $n_p$ denotes the number of times for which overflow of counter 106 has occurred during the interval from t2 to t3, and $f_p$ denotes the frequency of signal Sp.

At time t3, compensation timing signal S46 returns to the L level, thereby terminating counting by counter 106. The count therein is held stored until phase error clear signal S85 goes to the H level at time t5. The return of signal S46 to the L level results in a single pulse being output by latch circuit 112 as 1-pulse compensation signal S851, and a burst of 8 pulses being generated as 8-pulse compensation signal S852. The example FIG. 6 illustrates the case in which Cp=515 at time t3, and $n_p$ =1. Thus, since 512≦Cp at time t3, then compensation sign signal S84 is at the H level thereafter, and since 504≦Cp>520, the specific phase error signal S853 is at the H level. As a result, the 1-pulse signal S851 is transferred through AB -selector 118, to be output as pulse compensation signal S85, as shown in FIG. 6(i). It should be noted that the scale of FIG. 6(g) and FIG. 6(i) have been expanded in relation to the other timing diagram portions, in order to show how 8 pulses of signal S852 are generated during the one pulse of signal S851.

The condition of compensation sign signal S84 after time t3 serves to determine the direction in which compensation is to be applied, i.e. in a direction which increases the timebase signal frequency, or vice versa. In the present embodiment, signal S84 goes to the L level after time t3 if Cp>512, and goes to the H level if 512≦Cp. If 504≦Cp>520, then pulse compensation signal S853 is output as a single pulse at time t3, while for any other value of Cp, signal S85 is output as a burst of 8 pulses at time t3.

Aging compensation circuit 52 will now be described. Numeral 122 denotes a latch circuit, of similar configuration of circuit 112 described above. Synchronized timing signals $\phi_{2s}$ and $\phi_{512}$, having a period of 2 seconds and a frequency of 512 Hz respectively, are applied to inputs L1 and L2, and aging compensation synchronizing signal $\phi_A$ is produced from output Q. Numeral 124 denotes a switching duty ratio memory circuit, comprising a 10-stage up-down counter. Pulse compensation signal $S_{85}$ from comparator circuit 28 is applied to clock input $\phi$, while compensation sign signal $S_{84}$ is input to up-down mode input terminal UD. When the signal applied to the latter terminal is at the H level, counter 124 performs up-counting, while when this signal is at the L level, down-counting is performed. An AND gate 125 receives as inputs an output from a switching circuit 128, described hereafter, and the timing signal $\phi_{512}$, and produces a count-up signal $S_{213}$. This is applied to the clock input $\phi$ of a 10-stage presettable counter 126, which has data input terminals D0, D1, .... D9 coupled to corresponding output terminals Q0, Q1, ..... Q9 of switching duty ratio memory circuit 124. A preset enable terminal PE receives the aging compensation synchronizing signal $\phi_A$. An overflow signal $S_{214}$ is produced from output terminal Q9. When the signal applied to terminal PE is at the H level, then the signals applied to data input terminals D0 to D9 are preset into counter 126. Switching circuit 128 comprises a trigger-type flip-flop, having a clock input terminal to which the overflow signal $S_{214}$ is applied, a reset input R to which the aging compensation synchronizing signal $\phi_A$ is applied, and which produces an aging compensation signal $S_A$. The logic level of signal $S_A$ is inverted on each successive falling edge of signal $S_{214}$.

Figure 7:
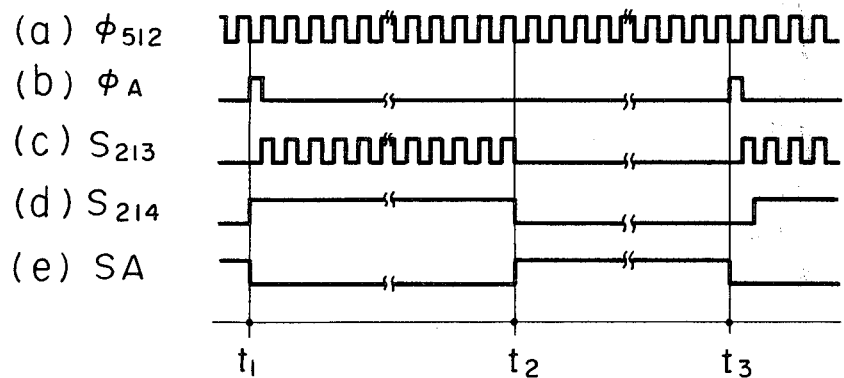

The operation of aging compensation circuit 52 will now be described, referring to the timing diagram of FIG. 7. FIG. 7(a) shows the 512 Hz timing signal $\phi_{512}$. FIG. 7(b) shows aging compensation synchronizing signal $\phi_A$, FIG. 7(c) shows the count-up signal $S_{213}$, FIG. 7(d) shows the overflow signal $S_{214}$, and FIG. 7(e) shows aging compensation signal $S_A$. The duration of the time interval from t1 to t3 is 2 seconds. The aging compensation synchronizing signal $\phi_A$ is generated as a pulse train having a period of 2 seconds. At time t1, the contents of presettable counter 126 are preset to the value of the count in switching duty ratio memory circuit 124, while $\phi_A$ is at the H level. In addition, aging compensation signal $S_A$ is reset to the L level, while the output from terminal Q of switching circuit 128 enables AND gate 213 to transfer the count-up signal $S_{213}$ to be counted by counter 126. Next, at time t2, overflow of counter circuit 126 occurs, and switching signal $S_{214}$ goes to the L level, thereby returning signal $S_A$ to the H level. Thereafter, AND gate 213 is inhibited, so that count-up signal $S_{214}$ is held at the L level, as shown in FIG. 7(c). Subsequently, from t3, the operations described above for the time interval t1 to t3 are successively repeated.

The contents of switching duty ratio memory circuit 124 will be designated as $C_c$. The duration of the time interval from t1 to t2 is given as:

$(1024 - C_c)/512$

As described above, the aging compensation duty ratio $D_A$ determines the duty ratio for which signal $S_A$ is at the H level. In this embodiment, the time from t2 to t3 is 2 seconds, and signal $S_A$ is at the H level during the time interval from t2 to t3. Thus, the following equation can be derived:

$$D_A = C_c/1024 \qquad (4)$$

It can be understood from the above that the compensation sign signal $S_{84}$ and the pulse compensation signal $S_{85}$, in combination, correspond to the aging data signal $S_{ag}$ described hereinabove with reference to FIG. 3. If the phase difference between timebase signal $S_L$ and high frequency signal $S_H$ has a value indicating that the frequency of signal $S_L$ should be increased, then compensation sign signal $S_{84}$ is set to the L level, thereby causing circuit 124 to count up. In this condition, either single pulses or bursts of eight consecutive pulses are periodically applied, as pulse compensation signal $S_{85}$, to be counted by up-down counter circuit 124, thereby incrementing the count value $C_c$ therein.

As shown by equation (4) such an increase of $C_c$ will cause an increase in duty ratio $D_A$, so that aging compensation signal $S_A$ will act to increase the frequency of the timebase signal, as described hereinabove. Similarly, if comparator circuit 28 detects that the timebase signal frequency is to be decreased, then compensation sign signal $S_{84}$ goes to the H level, whereby counting down is performed by counter 124 in response to the pulses of pulse compensation signal $S_{85}$. The value of $C_c$ is thereby decreased, so that duty ratio $D_A$ is decreased, and hence aging compensation signal $S_A$ acts to decrease the timebase signal frequency $f_L$.

The above can be summarized as follows. When temperature sensing section 22 detects that the temperature data value T meets the specific temperature requirement $120 \leq T > 136$, then oscillation timing signal $S_{45}$ goes to the H level during each of successive 32 second intervals, with a minimum period of 4 hours between these 32 second intervals. Thus, oscillation operation control circuit 24 sets HF oscillator circuit 26 into operation during each of the 32 second intervals. During the last half of each 32 second interval, temperature sensing section 22 sets comparison timing signal $S_{46}$ to the H level, causing comparator circuit 28 to perform phase comparison between timebase signal $S_L$ and high frequency signal $S_H$. In the present embodiment, the standard value of timebase signal $S_L$, which will be designated as $f_{LS}$, is 32768 Hz, while the standard value of HF oscillator signal $S_H$, designated as $f_{HS}$, is 4194304 Hz. The relationship between these frequency values can be expressed as $$f_{HS} = f_{LS} \times m \qquad (5)$$

where m is a positive integer, which is equal to 128 in the present embodiment. It will be apparent that such a relationship between frequencies $f_{HS}$ and $f_{LS}$ is a necessary one with the present embodiment, since comparator circuit 28 detects any difference in phase between the high frequency reference signal and the timebase signal, in other words comparator circuit 28 and aging compensation circuit 52 act to hold a constant phase relationship between these signals.

The operation of comparator circuit 28 is based upon a predetermined deviation being established between the actual value $f_H$ of the frequency of HF oscillator signal $S_H$ and the frequency value $f_{HS}$ (the latter being an integral multiple m of the standard frequency $f_{LS}$ of timebase signal $S_L$ which provides precise timekeeping accuracy). The greater the value of this frequency deviation of $f_H$, which will be designated as $d_H$, the higher will be the frequency of phase comparison signal $S_P$. With the present embodiment, the value of $d_H$ is such that if frequency $f_L$ is equal to $f_{LS}$, then the contents of phase difference counter circuit 106 will be almost equal to 512 at the end of each pulse of comparison timing signal $S_{46}$, i.e. at time $t_3$ in FIG. 6. This concept of providing deviation dH of the HF oscillator signal $S_H$ enables a high degree of resolution to be attained in the detection of slight variations in timebase signal frequency $f_L$ with respect to the reference HF oscillator signal $S_H$, with the aging compensation resolution attainable being thereby considerably enhanced by comparison with prior art methods.

To perform frequency setting with the embodiment of FIG. 4, the timebase signal frequency $f_L$ is adjusted to the standard value $f_{LS}$, and the HF signal frequency $f_H$ adjusted to provide the required amount of deviation $d_H$. The frequency of phase error signal $S_P$ is given by:

$$f_p = |f_H - f_L \times m| \quad (6)$$

The deviation of HF oscillator signal $S_H$ from the standard frequency $f_{HS}$ is given by the following equation:

$$d_H = \frac{f_H - f_{HS}}{f_{HS}} = \frac{32}{f_{HS}} + \frac{64}{f_{HS}} \times n_p \quad (7)$$

In the above, $n_p$ denotes the number of times that overflow occurs for phase difference counter 106 in comparator circuit 28. In the present embodiment, $n_p$ is a positive integer.

If it is assumed that $f_L \approx f_{LS}$, then by using equations (3), (6) and (7), the following equation can be derived giving the phase error count value $C_p$:

$$C_p = [(f_{HS} - f_L \times m) \times 16] + 512 \quad (8)$$

The case for which $f_L > f_{LS}$ will now be discussed. For this case, as can be seen from equation (8), Cp is less than 512, so that comparator circuit 28 sets the compensation sign signal $S_{84}$ to the L level. If $C_p \geq 504$, then the 1-pulse signal $S_{851}$ is output as signal $S_{85}$, while if Cp is less than 504, the 8-pulse signal $S_{852}$ is output as pulse compensation signal $S_{85}$. The aging compensation circuit 52 will then subtract these pulses of signal $S_{85}$ from the contents of switching duty ratio memory contents $C_c$. As a result, the value of aging compensation duty ratio $D_A$ is reduced, causing the timebase signal frequency $f_L$ to be lowered. Aging compensation circuit 52 thereby changes frequency $f_L$ in such as direction as to compensate for the deviation of $f_L$ from the standard value $f_{LS}$.

On the other hand, if $f_L$ is less than $f_{LS}$, then $C_p > 512$, compensation sign signal $S_{84}$ goes to the H level, and if Cp is less than 520, the contents $C_c$ of counter 124 are incremented by one, while if $C_p \geq 520$, $C_c$ is incremented by 8. Duty ratio $D_A$ is thereby increased, and as a result signal $S_A$ acts to increase the frequency of signal $S_L$, i.e. acts to bring frequency $f_L$ back toward the standard value $f_{SL}$.

In this way, the phase difference count value Cp is changed by each aging compensation operation, about a standard count value of 512, with the latter count value only being attained when $f_L = f_{LS}$, and such that the change in $C_c$ is limited to a maximum of ± 8, for each aging compensation operation. The term aging compensation operation, as used herein, designates the sequence of events which occur following each transition of signal $S_{46}$ to the H level, whereby the count value Cc is either increased or decreased by one or by eight. Thus, the amount of aging compensation applied by each aging compensation operation has a limited and strictly defined value. This serves to limit the effect of certain errors which can occur in the aging compensation process. Such errors can occur, for example, if there is a sudden rise of the timepiece operating temperature, causing a temperature-induced change in timebase signal frequency $f_L$, which the aging compensation circuits would attempt to correct. The amount of compensation provided by a single aging compensation operation is designed to meet the maximum rate of change in timebase signal frequency $f_L$ that will result from aging changes.

It should be noted that without this strict limitation of the amount of aging correction applied in each operation, it would be necessary to provide complex circuit means to eliminate errors which could arise due to sudden changes in timebase signal frequency, (due to temperature changes as stated above, or mechanical shock, etc). However with the arrangement of the present embodiment described above, only very simple circuit means are necessary, which can easily be practicably implemented.

The degree of resolution required for aging compensation, and the aging compensation range (i.e. the maximum range of deviation of the timebase signal frequency about the standard frequency value $f_{LS}$ which can be corrected by aging compensation operations) will now be considered. The duration of each time interval for which comparison timing signal $S_{46}$ is at the H level will be designated as the phase comparison interval $t_p$, and is 16 seconds in the present embodiment. The number of binary counter stages in phase error counter 106 of comparator circuit 28 will be designated as $k_p$, which in this embodiment is 10. The deviation $d_H$ of HF oscillator signal frequency $f_H$ from the standard value $f_{HS}$ is then given by the equation:

$$d_H = \frac{2^{K_p - 1}}{t_p \times f_{HS}} + \frac{2^{K_p}}{t_p \times f_{HS}} \times n_p \quad (9)$$

The phase error count Cp is then given by the following equation:

$$C_p = [(f_{HS} - f_L \times m) \times t_p] + 2^{K_p - 1} \quad (10)$$

With the present embodiment, equations (9) and (10) above become equations (7) and (8).

The resolution of comparator circuit 28 will be designated as dp, and the aging compensation range as hp. In this case;

$$dp = \frac{1}{t_p \times f_{HS}} \text{ and } hp = \frac{2^{K_p}}{t_p \times f_{HS}} \quad (11)$$

With the present embodiment, the following approximate values are obtained: dp=0.0149 ppm, and hp=15.26 ppm.

In the following the number of binary counter stages in switching duty ratio memory circuit 124 of aging compensation circuit 52 will be designated as Ka, (equal to 10, in the present embodiment), while the period of the aging compensation synchronizing signal $\phi A$ will be designated as Ta (equal to 2 seconds, with the present embodiment). The frequency of the signal applied to input L2 of latch circuit 122 of aging compensation circuit 52, and to the clock input terminal of counter circuit 124 must then be equal to $2^{Ka}/ta$. The resolution attained by aging compensation circuit 52 will be denoted as da, and the compensation range as ha. Using equation (1) above, the following is obtained:

$$d_A = \frac{f_{SWA}}{f_{LS}} \times \frac{1}{2^{KA}} \text{ and } h_A = \frac{f_{SWA}}{f_{LS}} \quad (12)$$

The actual resolution which is attained for fL will then be the larger of the two resolution values $d_p$ and $d_a$, while the actual compensation range attained in practice will be the smallest of the two values $h_p$ and $h_a$. It is therefore preferable to arrange that $d_p$ is close to $d_a$, and $h_p$ is close to $h_a$. Setting this as a condition, the following can be derived; from equations (11), (12) and (5):

$$K_A = K_p, f_{SWA} = 2^{KA}/(t_p \times m) \quad (13)$$

With the present embodiment, $K_a = K_p = 10$, while $t_p = 16$, and $n = 128$. Thus, $f_{swa} = 0.5$ Hz. A slight deviation from this value of $f_{swa}$ will have a slight effect upon the degree of resolution of aging compensation and the compensation range, but will not affect the aging compensation operations, in practice.

Figure 8A:
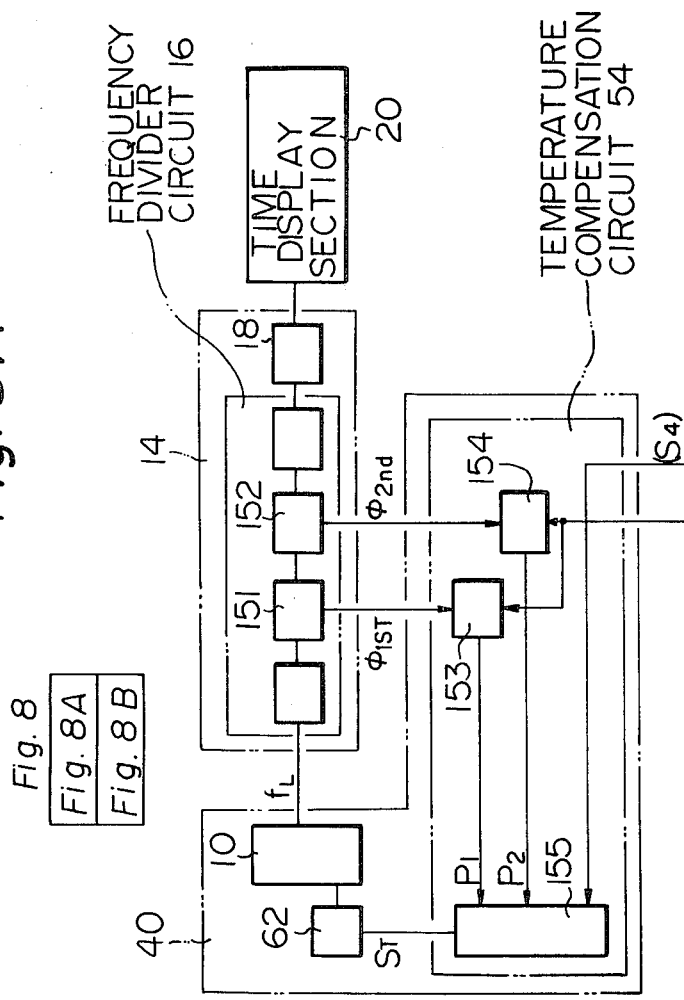

FIG. 8 shows circuit diagrams of a temperature compensation circuit 54 and temperature sensing circuit 68 of the embodiment of FIG. 3. In this embodiment, temperature data is gnerated as a digital value, using a temperature sensing oscillator circuit which is formed within the timepiece integrated circuit, without using external temperature sensing elements such as thermistors. However it should be noted that the present invention is equally applicable to various other temperature sensing arrangements.

FIG. 8 will be described with reference to the temperature characteristics shown in FIG. 9. Temperature data register 69 in temperature sensing circuit 68 produces bits $T_0$ to $T_8$ of temperature data signals S4, and supplies these to temperature compensation circuit 54. The latter circuit produces a temperature compensation signal $S_T$ from the temperature data signals, and supplies this to timebase frequency control circuit 62. A temperature sensing oscillator circuit 132 produces an output signal comprising a pulse train whose frequency varies according to temperature, and this signal is counted by a gate signal counter circuit 134, up to a preset count value. A comparison counter circuit 136 performs counting of a timing signal $\phi_c$ (comprising timebase signal $S_L$, or produced by frequency division of this signal) during each time interval in which counting by circuit 134 is carried out. The count value in comparison counter circuit 136 at the end of each of these intervals is stored in a temperature data register 69. The operation of circuits 69, 134 and 136 is controlled by a control circuit 138. Numeral 140 denotes a "numeric value A" memory circuit, which stores a value A representing the maximum count of gate signal counter 134. Numeral 142 denotes a "numeric value B" memory circuit, which stores a numeric value B to which counter circuit 136 is preset. In the present embodiment, memory circuits 140 and 142 are formed of elements within the timepiece integrated circuit. However it is equally possible to form these memory circuits from sets of contacts or switches provided external to the timepeice IC chip.

In the present embodiment, control circuit 138 of temperature sensing circuit 68 causes temperature sensing operations to be performed at 64 second intervals, and temperature data value T is set into the temperature data register 69 on each falling edge of synchronized timing signal $\phi 64s$. When a temperature sensing operation is to be initiated, first the data values A and B are preset into counters 134 and 136 respectively. Next, the output signal from temperature sensing oscillator circuit 132 is input to counter 134, and at the same time the synchronized timing signal $\phi_c$ is input to counter 136. If the period of the output signal from temperature sensing oscillator circuit 132 is designated as Pt, then since the maximum count value has been preset as A, counter 134 will terminate counting after a time of $A \times Pt$ seconds. During this time interval, counter 136 will overflow several times, and the temperature data value T is the count value in counter 136 when counting is terminated. This data value is then stored in temperature data register 69.

The temperature data value T is given by the following equation:

$$T = [A \times P_t \times f_c] + B - 2^{Kt} \times n_t \quad (14)$$

In the above, $K_t$ is the number of binary bits of temperature data register 69, while $n_t$ represents the number of times for which overflow of counter circuit 136 has occurred.

In temperature sensing oscillator circuit 132, numeral 144 denotes a temperature sensing voltage regulator circuit, which produces an output voltage VR whose value varies linearly with temperature. This voltage is converted to a current by a voltage/current converter circuit 145, which supplies a ring oscillator circuit 146, connected in series with converter 145. The output signal from oscillator circuit 146 is transferred through a waveform shaping circuit 148 to be input to a frequency divider circuit 150. Frequency divider circuit 150 serves to divide the frequency of the output signal from oscillator circuit 146 to a suitable value for input to counter 134. The supply of power to each of circuits 144, 145, 146, 148 and 150 is controlled by an inverter 152, in response to an output signal from control circuit 136, in a similar manner to that described hereinabove for HF oscillator circuit 26 and inverter 100 in FIG. 4. It can be understood from the above description that, when the input to inverter 152 goes to the H level, a current whose level is determined by the timepiece temperature is supplied to ring oscillator circuit 146. The frequency of oscillation of oscillator circuit 146 varies in a substantially linear manner with variation of temperature, as a result of variation of the current supplied from converter circuit 145 with temperature, and the relationship between the period Pt of this oscillation signal and temperature is given by the following equation:

$$P_t = \alpha \times \theta + P_{t_o} \quad (15)$$

Here, $\theta$ represents temperature, and $Pt_o$ is the value of Pt at 0° C., while $\alpha$ is a temperature coefficient. Thus, from equations (14) and (15), the temperature data value T is given by the following:

$$T = [A \times f_c \times (\alpha \times \theta + Pt_o)] + B - 2^{Kt} \times n_t \quad (16)$$

If the overflow item $2^{Kt} \times n_t$ is eliminated from equation (16), then the equation expresses a linear relatiohship between T and $\theta$. This relationship can be freely adjusted by variation of the numeric values A and B.

As shown in FIG. 8, synchronized timing signals are applied from frequency divider circuit 16 to temperature compensation circuit 54. Frequency divider circuit 16 comprises a number of frequency divider circuit sections, two of which are denoted by numerals 151 and 152, with each of these circuit sections producing a 7-bit output signal. The 7 bits of the output from circuit section 151 will be designated as $\phi_{1st}$, and that from section 152 as $\phi_{2nd}$. Numeral 153 denotes a first comparator circuit which compares the least significant 7 bits $T_0$ to $T_6$ of temperature data signal $S_4$ from temperature data register 69, and outputs a signal $P_1$ at the H level from the time at which all of the 7 bits of signal $\phi_{1st}$ are at the L level until the time when they correspond to each of the 7 bits of the temperature data signal $T_0$ to $T_6$. A second comparator circuit compares the 7 bits from $T_0$ to $T_6$ from temperature data register 69 with the second synchronizing signal $\phi_{2nd}$, and which produces an output signal $P_2$ at the H level from the time when the 7 bits of signal $\phi_{2nd}$ are all at the L level until the time when they correspond with the 7 bits $T_0$ to $T_6$ of the temperature data signal. A pulse synthesizing circuit 155 synthesizes the temperature compensation signal $S_T$ from signals $P_1$ and $P_2$, and from the most significant two bits, $T_7$ and $T_8$ of the temperature data signal.

In the following explanation of the operation of temperature compensation circuit 54, the numeric value represented by the 7 least significant bits $T_0$ to $T_6$ of the contents of temperature data register 69 will be designated as n, and the period of the input signal applied to first frequency divider section will be assumed to be 1 (in arbitrary units), so that if the periods of signals $P_1$ and $P_2$ are 128 and 16384 respectively, then the duty ratios of each of these signals (i.e. with respect to the H level) will both be equal to n/128. When most significant bit $T_8$ of the temperature data signals is at the H level, pulse synthesizing circuit 155 sets temperature compensation signal $S_T$ to the H level, i.e. the temperature compensation duty ration DT can be expressed by the following equation:

$$D_T = 1 (256 \leq T > 512) \tag{17}$$

Conversely, when bit $T_8$ is at the L level, and $T_7$ is at the H level, then the logical product of signals $P_1$ and $P_2$ is produced as temperature compensation signal $S_T$. In this case, the time for which signal $S_T$ is at the H level during 16384 periods of signal $S_T$ is equal to $n^2$, so that temperature compensation duty ratio $D_T$ is given by the following:

$$D_T = 16384/n^2$$

On the other hand, if both bits $T_7$ and $T_8$ are at the L level, then temperature compensation signal $S_T$ is produced as the logical product $\overline{P_1} \cdot \overline{P_2}$ and the time for which signal $S_T$ is at the H level during 12384 periods thereof will be $(128-n)^2$. The value of n is related to the temperature data value T as follows:

$$n = T \qquad (O \leq T < 128)$$
$$n = T - 128 \qquad (128 \leq T < 256)$$

so that in this case, the duty ratio $D_T$ is given by the following:

$$D_T = \frac{(T - 128)^2}{16384} \quad (O \leq T < 256) \tag{18}$$

Thus, temperature compensation circuit 40 serves to determine the value of the duty ratio $D_T$ of temperature compensation signal $S_T$ in accordance with the data stored in temperature data register 69.

The temperature compensation operation provided by the circuits described above will now be explained with reference to FIG. 9, in which the horizontal axis represents temperature in ° C. FIG. 9(a) shows the temperature characteristic of timebase signal generating section 40. FIG. 9(b) shows the temperature characteristic of temperature compensation duty ratio $D_T$. FIG. 9(c) shows the temperature characteristic of the temperature data value T. The timebase signal frequency $f_L$ is expressed by equation (1) given hereinabove. The values of $f_L$ for the case of $D_T$ having values of 1 and 0 will be designated as $f_{L0}$ and $f_{L1}$. Then:

$$f_{L0} = f_B - f_{SWA} \times (1 - D_A) - f_{SWT} \tag{19}$$

$$f_{L1} = f_{L0} + f_{SWT} \tag{20}$$

As explained hereinabove, the aging compensation duty ratio $D_A$ and the temperature compensation duty ratio $D_T$ affect the timebase signal frequency $f_L$ independently of one another. For simplicity, however, the aging compensation duty ratio $D_A$ will be assumed to be constant. The LF oscillator frequency $f_B$ displays a second order curvature temperature characteristic, and $f_{SWA}$ and $f_{SWT}$ can be considered constant with respect to temperature. The temperature corresponding to the peak frequency of the temperature characteristic of $f_B$ will be designated as $\theta_{ZT}$, and the temperature coefficient as a. If $f_{L0}$ at temperature $\theta_{ZT}$ is H set to a value of 32768 Hz (i.e. equal to $f_{LS}$), then the frequency deviations $d_0$ and $d_1$ of $f_L$ with respect to $f_{L0}$ and $f_{L1}$ will be given by the following equations:

$$d_O = \frac{f_{L0} - f_{LS}}{f_{LS}} = a(\theta - \theta_{ZT})^2 \tag{21}$$

$$d_1 = \frac{f_{L1} - f_{LS}}{f_{LS}} = a(\theta - \theta_{ZT})^2 + d_{SWT} \tag{22}$$

In the above, $d_{SWT}$ is a constant equal to $f_{SWT}/f_{LS}$. For the example shown in FIG. 9, $\theta_{ZT} = 25°$ C., $a = -0.033$ ppm/° C. and $d_{SWT} = 30$ ppm.

In FIG. 9(a), the vertical axis represents the deviation in ppm of $f_{LS}$. Characteristics 157 and 156 are given by equations (21) and (22) above. The values of temperature for which d1 becomes zero will be designated as $\theta_1$ and $\theta_2$ respectively, and are given by the following equations:

$$\theta_1 = \theta_{ZT} - \sqrt{\frac{d_{SWT}}{-a}}, \quad \theta_2 = \theta_{ZT} + \sqrt{\frac{d_{SWT}}{-a}} \tag{23}$$

Figure 9:
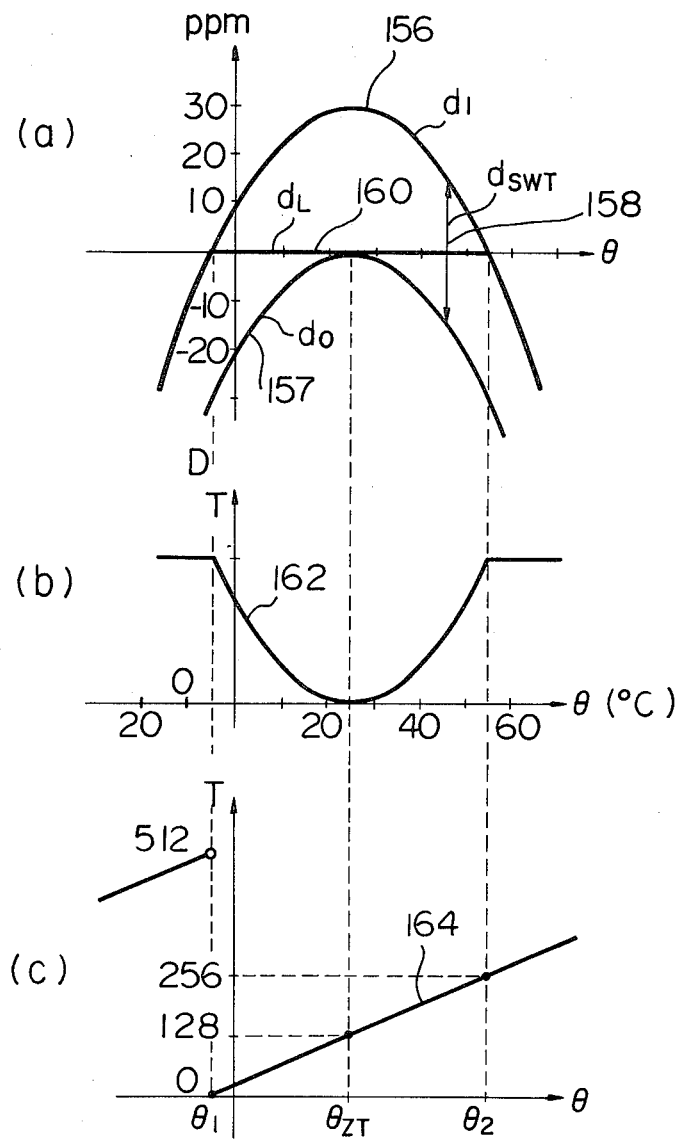
FIG. 9 is a diagram showing frequency/temperature characteristics, for assistance in describing the circuits of FIG. 8.

In the example of FIG. 9, $\theta_1 = -5.15°$ C., and $\theta_2 = 55.15°$ C. As shown by FIG. 9(c), the value of temperature data value T is adjusted such that $\theta_1$ and $\theta_2$ become zero and 256 respectively, with this adjustment being performed in accordance with the following equation:

$$T = 128\left[\sqrt{\frac{-\alpha}{d_{SWT}}}(\theta - \theta_{ZT}) + 1\right] \quad (24)$$

In this example, T=4.2453×θ+21.87. This adjustment of T is performed by adjustment of the values A and B in equation (16). Since with the present embodiment, temperature data value T comprises 9 bits, digital quantization errors will exist in this value of T, however if these are ignored, the variation of T shown in FIG. 9(c) is obtained. The temperature compensation duty ratio $D_T$ varies as shown in FIG. 9(b), from equations (17) and (18). If the value of $f_B$ given by equation (1) is substituted in equation (19), then the following equation can be derived:

$$f_L = f_{LO} + f_{SWT} \times D_T$$

In addition, by applying equations (21) and (22), the frequency deviation of LF oscillation signal fL, i.e. dL, is given by the following:

$$d_L = d_O + d_{SWT} \times D_T \quad (25)$$

Combining this with equation (17), the following can be derived:

$$d_L = d_O + d_{SWT} (256 \leq T > 512)$$

so that in fact:

$$d_L = d_1 \quad (256 \leq T > 512) \quad (26)$$

Furthermore, by combining equations (25) and (18), the following can be derived:

$$d_L = d_O + d_{SWT} \times \frac{(T-128)^2}{16384} \quad (O \leq T < 256)$$

Thus, by inserting the value of T given by equation (24) in the latter equation, then:

$$d_L = d_{Oa}(\theta - \theta_z)^2 \quad (0 \leq T > 256)$$

so that, from equation (21),:

$$d_L = 0 \quad (0 \leq T > 256) \quad (27)$$

The variation of this deviation $d_L$ of the LF oscillation frequency $f_L$ is therefore as shown in FIG. 9(a), from equations (26) and (27). Temperature compensation is thereby achieved for the range of temperatures from $\theta_1$ to $\theta_2$.

Figure 10:
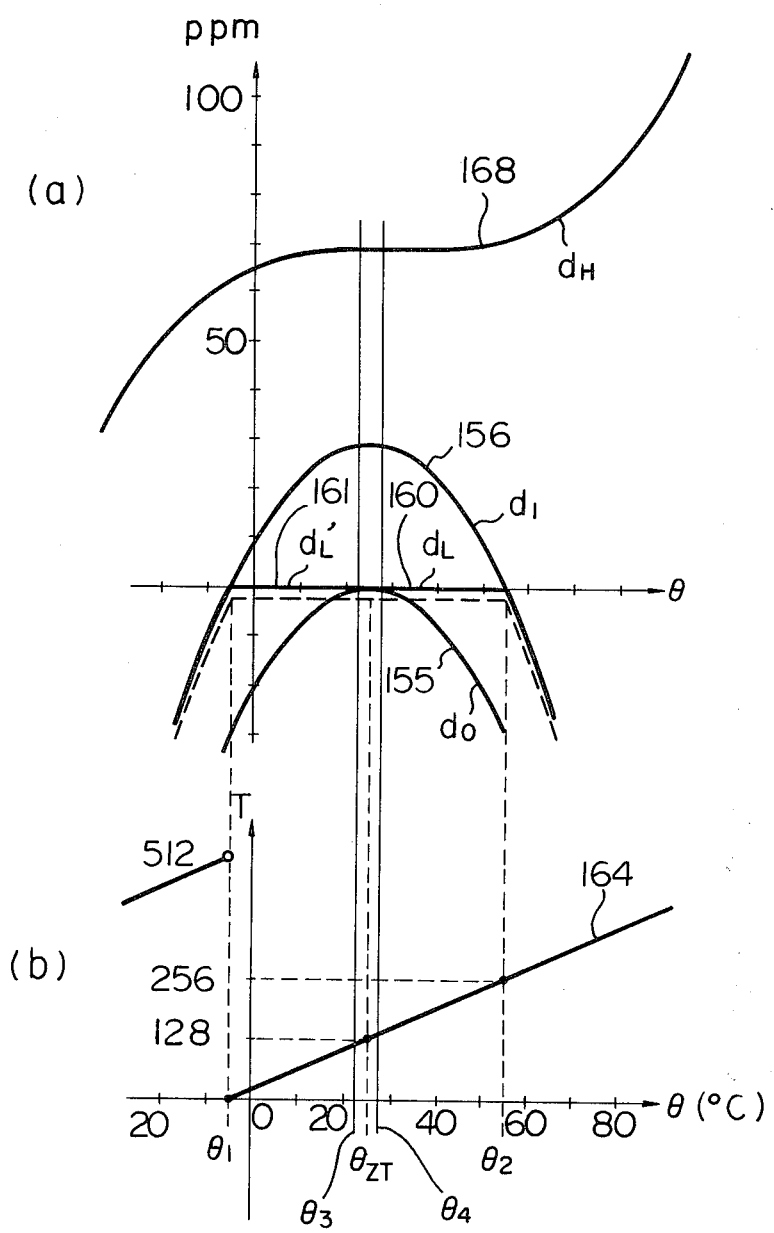
FIG. 10 is a diagram of frequency/temperature characteristics, for assistance in describing the circuits of FIG. 3, FIG. 4 and FIG. 8.

The overall operation of an electronic timepiece according to the present invention will now be described, with reference to FIG. 10(a) and 10(b), in which the horizontal axes represent temperature θ in °C. FIG. 10(a) shows the temperature characteristics of frequency deviations of HF and LF oscillator circuits 26 and 10, while FIG. 10(b) shows the temperature characteristic of temperature data value T. In FIG. 10(a), curves $d_O$, $d_1$ and $d_L$ correspond to equations (21), (22), and (26), (27). Curve $d_H$ shows the deviation of HF oscillator signal SH, which has been set such that $n_p=4$ within the specific temperature range $\theta_3$ to $\theta_4$. As can be seen, the change in deviation $d_H$ within the range $\theta_3$ to $\theta_4$ is very small, and can be ignored.

The choice of a value of 4 for $n_p$ is due to the fact that there must be a substantial difference between $d_H$ and $d_L$, in order to ensure accuracy of phase comparison by comparator circuit 28, and with the values of $d_O$ and $d_1$ selected in the present embodiment, it is an essential condition that $n_p \geq 2$. Thus, a value of 4 for $n_p$ assures complete safety.

As explained above, the specific temperature range in this embodiment corresponds to the range of values $120 \leq T > 136$. Using equation (24), it can be seen that this represents the temperature range from $\theta_3 = 23.1°$ C. to $\theta_2 = 26.9°$ C., i.e. approximately 25° C.±2°.

In the above, it has been assumed that deviation $d_L$ corresponds to zero. However if the LF oscillator frequency should drift to a value other than zero deviation due to some cause other than a change in timepiece temperature (i.e. due to L.F. oscillator vibrator element aging), then the aging compensation operations described above will be carried out, to thereby bring the frequency deviation back to zero within a period of time which will be very short by comparison with the rate of frequency drift.

With the present embodiment, input capacitor 94 or output capacitor 96 of HF oscillator circuit 26 is mounted external to the timepiece IC chip, and is varied to adjust the frequency $f_H$ to the required value. In the case of LF oscillator circuit 10, quartz crystal vibrator element 46 is glass-encapsulated, and laser trimming of the vibrator is performed to adjust the frequency of signal $S_L$. Usually, such laser frequency trimming results in a marked increase in frequency drift due to aging, in an electronic timepiece. However with a timepiece according to the present invention, such effects are eliminated as described hereinabove. With such an arrangement, the only components of the timepiece circuit which must be provided external to the IC chip are the quartz crystal vibrator elements 46 and 92, and a trimming capacitor comprising either of capacitors 94 or 96. Furthermore, the amount of capacitance variation required to adjust the frequency of HF oscillator circuit 26 is very small, since the maximum amount of adjustment required is ¼ of the aging adjustment range (e.g. 7.63 ppm). Since the value of trimming capacitance can thereby be very small, a high degree of frequency stability of HF oscillator circuit 26 is assured.

In addition to the use of laser trimming, other methods of adjustment of the frequency of LF oscillator circuit 10 can be employed, such as the selection of crystal vibrators having a desired frequency. Another method is to increase the number of stages in switching duty ratio memory circuit 124 in FIG. 4, to thereby increase the aging compensation range $h_A$, and in this way to provide a surplus amount of aging compensation range which can be utilized to compensate for an inherent frequency deviation of LF oscillator circuit quartz crystal vibrator 46.

Figure 11:
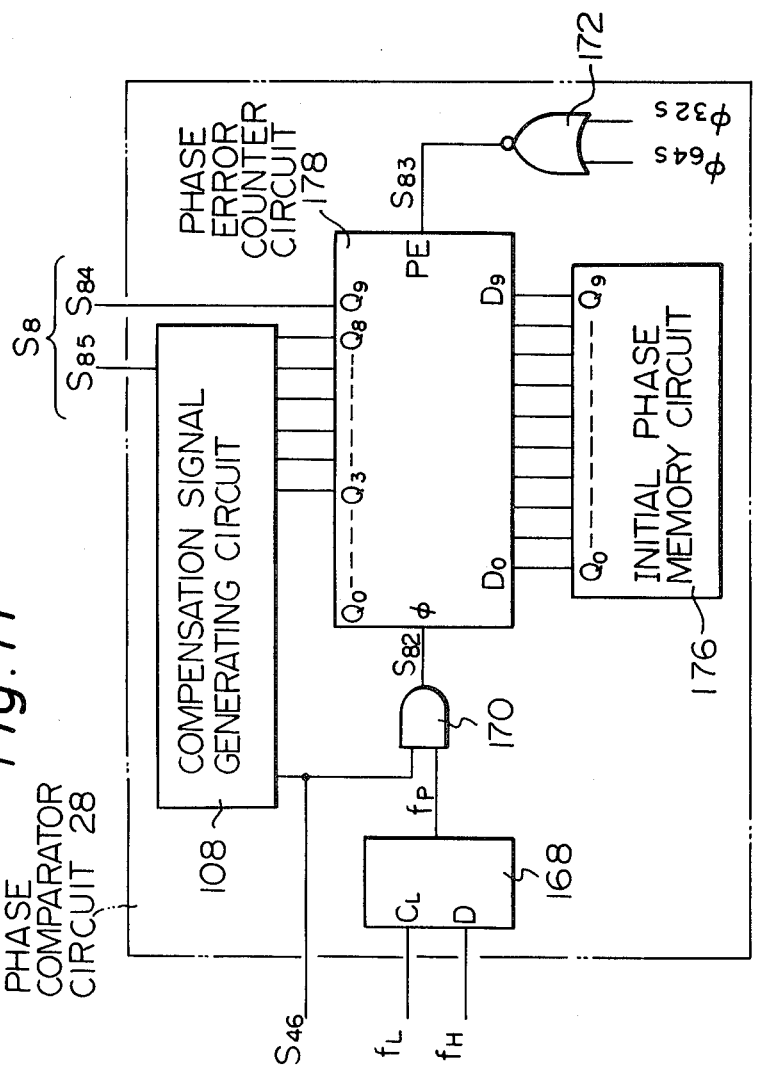
FIG. 11 is an alternative example of a frequency comparator circuit for use in the embodiment of FIG. 4.

An alternative example of a circuit for comparator circuit 28 is shown in FIG. 11. This is basically similar to the circuit of FIG. 4, but also incorporates an initial phase memory circuit 176, and minor circuit modifications. Phase memory circuit 176 has 10 output terminals, QO to Q9, from which a 10-bit initial phase difference signal S86 is output. Circuit 176 can comprise either elements formed within the timepiece IC chip, or a set of interconnectable contacts provided external to the IC chip. Numeral 178 denotes a 10-bit presettable counter, used as the phase error counter, which receives as inputs the contents of initial phase memory circuit 176 on data input terminals D0 to D9. A phase error preset signal S83 (identical to the phase error clear signal S83 in the embodiment of FIG. 4) is applied to the preset enable terminal PE of phase error counter 87.

If the contents of initial phase memory circuit 176 are designated as Cs, then the count value Cp of equation (3) is given by the following:

$$C_p = (f_p \times 16 + C_s) - 2^{10} \times n_p \qquad (28)$$

and setting of the HF signal frequency fH is performed as shown by the following equation:

$$fH = f_{HS} + 32 \times 512 - C_s/512 + 64 \times n_p \qquad (29)$$

If Cs is assumed to be an integer which meets the requirement $0 \leq C_s > 1024$, then the phase error count value Cp is identical to that given by equation (8). In fact, Cs is a digital quantity. However, if digital quantization errors are ignored, then the aging compensation operation provided by the circuit of FIG. 11 is identical to that of the circuit of FIG. 4.

Thus, by using the circuit of FIG. 11, it can be understood that modification of the contents Cs of initial phase memory circuit 176 is equivalent to adjustment of the frequency of oscillation of HF oscillator circuit 26. Thus, if the embodiment of comparator circuit 28 shown in FIG. 11 is utilized, it is unnecessary to provide an external trimming capacitor to adjust the value of frequency fH, so that the only components of the timepiece circuit external to the IC chip will be the HF and LF quartz crystal vibrators. Alternatively, it is possible to utilize an external trimming capacitor coupled to HF oscillator circuit 26, but to use this to set the frequency of oscillation thereof to a value which provides optimum frequency stability for that oscillator circuit.

The basic features of an electronic timepiece according to the present invention can be summarized as follows. Firstly, a phase comparison circuit detects any changes in the phase relationship between a low frequency oscillator signal SL, used as the timepiece timebase signal, and a high frequency signal SH, used as a frequency reference, to thereby detect any drift in the frequency fL of SL due to aging effects. Control of the frequency fL is then performed by variation of the duty ratio $D_A$ of an aging compensation signal $S_A$, this variation being performed in accordance with the results of the phase comparison, with signal $S_A$ being applied to a timebase frequency control circuit. This aging compensation is performed repetitively, while a temperature sensing section detects that the timepiece temperature is within a predetermined narrow range.

Secondly, the temperature sensing section generates temperature data signals, which are applied to a temperature compensation circuit. This circuit produces a temperature compensation signal ST, whose duty ratio DT is varied in accordance with temperature. This signal is applied to a timebase frequency control circuit for thereby compensating the timebase signal frequency for changes due to temperature variations.

The following additional points should be noted. Firstly, the width of the specific temperature range within which aging compensation operations are performed can be increased, if required, by selecting a quartz crystal vibrator for HF oscillator circuit 26 which displays only a small amount of frequency deviation with changes in temperature.

Secondary, with the method of LF oscillator circuit frequency control used in the preferred embodiment described above, each individual aging compensation operation or temperature compensation operation is completed in less than 2 seconds. Thus, a timepiece according to the present invention is completely compatible with the most widely used types of timekeeping rate measurement equipment, which measure a timekeeping rate within a short period of time.

From the above, it can be understood that an electronic timepiece according to the present invention provides the advantages of a timebase signal source utilizing an XY-cut quartz crystal vibrator operating at a relatively low frequency, i.e. the capability for simple and accurate compensation for frequency variations due to temperature changes, and a low level of power consumption, with the advantages of an AT-cut quartz crystal vibrator-controlled timebase oscillator, i.e. a very high degree of frequency stability with respect to aging. Such a timepiece can thereby attain a timekeeping accuracy of the order of better than one second of error per year, and can maintain such an accuracy over a long period of time. Furthermore, as can be understood from the preferred embodiments described above, such a timepiece can be constructed by the addition of only a relatively small amount of additional circuitry to a timepiece IC chip and the addition of a single quartz crystal vibrator, and does not have a significantly increased power consumption by comparison with prior art timepieces. It can further be understood that it is not necessary to specially select the quartz crystal vibrators used in an electronic timepiece according to the present invention for particular frequency/temperature characteristics, so that such a timepiece can be economically produced on a mass-production basis.

From the above description, it will be apparent that the objectives set forth for the present invention are effectively attained. Since various changes and modifications to the above construction may be made without departing from the spirit and scope of the present invention, it is intended that all matter contained in the above description or shown in the accompanying drawings shall be interpreted as illustrative, and not in a limiting sense. The appended claims are intended to cover all of the generic and specific features of the invention described herein.

What is claimed is:

1. An electronic timepiece comprising:
    a low frequency oscillator circuit controlled by a first quartz crystal vibrator, for producing a time base signal;
    frequency divider circuit means for performing frequency division of said timebase signal to produce a unit time signal;
    time display means responsive to said unit time signal for displaying time information;
    a high frequency oscillator circuit controlled by a second quartz crystal vibrator for producing a high frequency signal;
    temperature sensing means for producing a temperature data signal indicative of a current operating temperature of said electronic timepiece, said temperature sensing means including means for producing a specific temperature condition signal for indicating that said operating temperature is within a predetermined specific temperature range;

comparator means for comparing the frequencies of said high frequency signal and said timebase signal, to detect an error in the frequency of said unit time signal by measuring deviations of said timebase signal from a predetermined standard value thereof, said standard value having a predetermined relationship to the frequency of said high frequency signal, and for producing output signals indicative of said timebase signal frequency deviation, said comparator means being controlled by said specific temperature condition signal from said temperature sensing means for performing said frequency comparison only when said operating temperature is within said specific temperature range;

temperature compensation means responsive to said temperature data signals from said temperature sensing means for compensating said unit time signal frequency for a deviation therein resulting from the effects of temperature variation upon said first quartz crystal vibrator; and aging compensation means responsive to said output signals from said comparator means for compensating said unit time signal frequency for variations therein resulting from aging of said first quartz crystal vibrator.

2. An electronic timepiece according to claim 1 and further comprising an oscillation operation control circuit controlled by said specific temperature condition signal for enabling oscillation of said high frequency oscillator circuit only when said operating temperature is within said specific temperature range.

3. An electronic timepiece according to claim 1 in which said aging compensation means comprise a first timebase frequency control circuit coupled to said low frequency oscillator circuit and responsive to said output signals from said comparator means for controlling said timebase signal frequency, and in which said temperature compensation means comprise a second timebase frequency control circuit coupled to said low frequency oscillator circuit and responsive to said temperature data signals from said temperature sensing means for controlling said timebase signal frequency.

4. An electronic timepiece according to claim 3, in which each of said first and second timebase frequency control circuits is operative to control a value of capacitance in said low frequency oscillator circuit by means of time-division capacitor switching.

5. An electronic timepiece according to claim 3, in which said aging compensation means comprise an aging compensation circuit for generating an aging compensation signal, said aging compensation signal having a duty ratio which is controlled by said output signals from said comparator means and in which said first timebase frequency control circuit comprises a capacitor and switching means for periodically coupling said capacitor to said low frequency oscillator circuit during intervals of duration determined by said duty ratio of said aging compensation signal, and in which said temperature compensation means comprise a temperature compensation circuit for generating a temperature compensation signal, said temperature compensation signal having a duty ratio which is controlled by said temperature data signals from said temperature sensing means, and in which said second timebase frequency control circuit comprises a capacitor and switching means for periodically coupling said capacitor to said low frequency oscillator circuit during time intervals of duration determined by said duty ratio of said temperature compensation signal.

6. An electronic timepiece according to claim 5, in which said low frequency oscillator circuit comprises an oscillation inverter coupled to said first quartz crystal vibrator, and in which said capacitor of said first timebase frequency control circuit is coupled periodically to an input terminal of said oscillation inverter, and in which said capacitor of said second timebase frequency control circuit is coupled periodically to an output terminal of said oscillation inverter.

7. An electronic timepiece according to claim 5, in which said comparator means comprise:

a phase comparator circuit coupled to receive said timebase signal and said high frequency signal, for producing a phase error signal comprising a train of pulses of frequency proportional to a difference in phase between said timebase signal and said high frequency signal;

a phase error counter circuit coupled to said phase comparator circuit, for counting a number of pulses of said phase error signal produced during a time interval of predetermined duration; and a compensation signal generating circuit coupled to said phase error counter circuit, for generating a first output signal indicative of an amount of frequency compensation to be applied to said timebase signal and a second output signal for selectively indicating that said frequency compensation is to be applied in an increasing or in a decreasing direction of frequency change, said first and second output signals being applied to said aging compensation circuit.

8. An electronic timepiece according to claim 7, in which the frequency of said high frequency oscillator circuit is selected such that a maximum count value of said phase error counter circuit is exceeded a predetermined plurality of times during each of said count intervals of said phase error counter circuit, while said operating temperature is within said specific temperature range.

9. An electronic timepiece according to claim 7, in which said first output signal from said compensation signal generating circuit is a pulse compensation signal comprising a predetermined number of pulses generated after each of said time intervals in which counting is performed by said phase error counter circuit, and in which said second output signal from said compensation signal generating circuit comprises a compensation sign signal which is selectively set to a first or a second logic level potential for designating an increasing or a decreasing direction of compensation respectively of said timebase signal frequency.

10. An electronic timepiece according to claim 9, in which said aging compensation circuit comprises a switching duty ratio memory circuit whose contents are selectively incremented and decremented by said pulse compensation signal in accordance with the logic level of said compensation sign signal.

11. An electronic timepiece according to claim 10, in which said aging compensation circuit further comprises a presettable counter circuit and means for periodically setting the contents of said switching duty ratio memory circuit into said presettable counter circuit as an initial count value and for applying a train of pulses of fixed frequency to be counted by said presettable counter circuit to a predetermined maximum count value, the duration of said counting operation serving to determine said duty ratio of said aging compensation signal.

12. An electronic timepiece according to claim 10, and further comprising circuit means for selectively determining said predetermined number of pulses of said pulse compensation signal in accordance with the contents of said phase error counter circuit, such that the number of said pulses of said pulse compensation signal is selectively increased and decreased in accordance with whether the count in said phase error counter circuit is within or outside a predetermined count value range at the end of each of said intervals in which counting is performed by said phase counter circuit.

13. An electronic timepiece according to claim 12, in which a single pulse is generated as said pulse compensation signal at the end of each of said counting intervals of said phase error counter circuit if said count is within said predetermined count value range, and in which a fixed plurality of pulses are generated as said pulse compensation signal after each of said counting intervals if said count in said phase error counter circuit is outside said predetermined count value range.

14. An electronic timepiece according to claim 9, in which the frequency of said high frequency signal is set to a value differing from a standard high frequency value by a predetermined frequency deviation, said standard high frequency value being an integral multiple of said standard value of said timebase signal frequency, said predetermined frequency deviation being selected such that, when said timebase signal frequency is identical to said standard value thereof, then the contents of said phase error counter circuit at the end of each of said count intervals thereof will be close to a count value at which an output signal from the most significant counter stage of said phase error counter circuit changes from a first logic level to a second logic level.

15. An electronic timepiece according to claim 14, in which said output signal from said most significant stage of said phase error counter circuit constitutes said compensation sign signal.

16. An electronic timepiece according to claim 9, in which said comparator means further comprises an initial phase memory circuit operable to store a count preset value, and means for presetting said count preset value into said phase error counter circuit as an initial count value prior to each of said count intervals thereof, said count preset value being selected such that, when said timebase signal frequency is identical to said standard value thereof, then the contents of said phase error counter circuit at the end of each of said count intervals thereof will be close to a count value for which an output signal from the most significant counter stage of said phase error counter circuit changes from a first logic level to a second logic level.

17. An electronic timepiece according to claim 16, in which said output signal from said most significant stage of said phase error counter circuit constitutes said compensation sign signal.

18. An electronic timepiece according to claim 1, in which said temperature sensing means generates a plurality of binary signals comprising in combination said temperature data signal, and in which said temperature sensing means further comprise a specific temperature sensing circuit coupled to receive said plurality of binary signals and operative to detect combinations of logic levels thereof corresponding to values of operating temperature which are within said specific temperature range, and responsive to said detection for producing said specific temperature condition signal.

19. An electronic timepiece according to claim 18, in which said temperature sensing means comprises:
   a temperature sensing oscillator circuit for generating temperature sensing signal comprising a train of pulses whose period varies in accordance with changes in said operating temperature;
   counter circuit means for counting said temperature sensing signal pulses, starting from a predetermined initial count value, during successively repeated time intervals; and
   a temperature data register responsive to the contents of said counter circuit means for storing data representing said temperature data signal, and for generating said plurality of binary signals.

20. An electronic timepiece according to claim 19, in which said temperature sensing oscillator circuit comprises circuit means for producing a current whose level varies in accordance with said operating temperature, and an oscillator circuit whose frequency of oscillation is controlled by said level of current.

* * * * *